US007139402B2

(12) United States Patent
Abe et al.

(10) Patent No.: US 7,139,402 B2
(45) Date of Patent: Nov. 21, 2006

(54) SOUND REPRODUCTION DEVICE

(75) Inventors: Kazutaka Abe, Osaka (JP); Kenichi Terai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 821 days.

(21) Appl. No.: 10/208,089

(22) Filed: Jul. 29, 2002

(65) Prior Publication Data

US 2003/0021428 A1 Jan. 30, 2003

(30) Foreign Application Priority Data

Jul. 30, 2001 (JP) ............................ 2001-230623

(51) Int. Cl.

| | |
|---|---|
| ***H04R 1/40*** | (2006.01) |
| ***H04R 1/02*** | (2006.01) |
| ***H04R 29/00*** | (2006.01) |
| ***H03G 5/00*** | (2006.01) |

(52) U.S. Cl. ........................... 381/97; 381/98; 381/99; 381/89; 381/59

(58) Field of Classification Search .................. 381/97, 381/98, 99, 59, 89, 61, 17

See application file for complete search history.

(56) References Cited

U.S. PATENT DOCUMENTS

| | | | | |
|---|---|---|---|---|
| 3,088,997 A | | 5/1963 | Bauer | |
| 3,781,475 A | * | 12/1973 | Sharp | 381/62 |
| 4,399,328 A | * | 8/1983 | Franssen et al. | 381/1 |
| 4,403,112 A | * | 9/1983 | Modafferi | 381/98 |
| 5,033,092 A | | 7/1991 | Sadaie | |
| 5,095,507 A | | 3/1992 | Lowe | |
| 5,185,801 A | * | 2/1993 | Meyer et al. | 381/59 |
| 5,208,860 A | | 5/1993 | Lowe et al. | |
| 5,301,237 A | * | 4/1994 | Fosgate | 381/89 |
| 5,617,477 A | | 4/1997 | Boyden | |
| 5,828,763 A | * | 10/1998 | Koyano et al. | 381/97 |
| 5,870,484 A | * | 2/1999 | Greenberger | 381/300 |
| 5,930,376 A | * | 7/1999 | Markow et al. | 381/333 |
| 5,953,432 A | | 9/1999 | Yanagawa et al. | |
| 5,974,153 A | | 10/1999 | Cashion et al. | |
| 6,683,962 B1 | * | 1/2004 | Griesinger | 381/97 |
| 6,760,447 B1 | * | 7/2004 | Nelson et al. | 381/17 |

FOREIGN PATENT DOCUMENTS

| | | | |
|---|---|---|---|
| DE | 00486095 A | * | 5/1938 |
| EP | 1 113 702 | | 7/2001 |
| GB | 486 095 A | | 5/1938 |
| JP | 05-041897 | | 2/1993 |
| JP | 07-022878 | | 1/1995 |
| WO | WO 97 30566 A | | 8/1997 |

OTHER PUBLICATIONS

European Search Report dated Jan. 21, 2004 for Application No. EP 02 01 6388.

* cited by examiner

*Primary Examiner*—Vivian Chin
*Assistant Examiner*—Devona E. Faulk
(74) *Attorney, Agent, or Firm*—RatnerPrestia

(57) ABSTRACT

A sound reproduction device of the present invention includes: a first loudspeaker; a second loudspeaker; a first loudspeaker drive section for driving the first and second loudspeakers, the first loudspeaker drive section drives the first and second loudspeakers at substantially the same phase in a first frequency band, and the first loudspeaker drive section drives the first and second loudspeakers at substantially inverse phase and substantially different amplitude levels in a second frequency band higher than the first frequency band.

14 Claims, 17 Drawing Sheets

SOUND REPRODUCTION DEVICE

BACKGROUND OF THE INVENTION

1. Field of the Invention

The present invention relates to a sound reproduction device, and more particularly to a sound reproduction device which can be preferably used in a mobile terminal apparatus.

2. Description of the Related Art

In recent years, mobile terminal apparatuses, such as cellular phones, Personal Handy Phone Sets (PHS) and Personal Digital Assistants (PDA), have come to have an internet connection function, and therefore the mobile terminal apparatuses are becoming more multifunctional. For example, a mobile terminal apparatus having a function of downloading music data from a music distribution server via the internet so as to store the downloaded music data to a semiconductor memory in the mobile terminal apparatus and a function of reproducing the music data stored in the semiconductor memory is produced on a commercial basis.

In the case where music or a ringtone is represented as a two-channel signal, it is desirable that the number of output channels is equal to or more than two. However, in order to provide a plurality of loudspeakers to a mobile terminal apparatus, the plurality of loudspeakers must be positioned so as to be extremely close to each other. This is because a space in the mobile terminal apparatus is very limited.

Conventionally, a method for driving such a plurality of loudspeakers positioned extremely close to each other has not been considered. This is because only one loudspeaker is provided to a conventional mobile terminal apparatus and there is no assumption that a plurality of loudspeakers would be provided to the conventional mobile terminal apparatus.

SUMMARY OF THE INVENTION

According to one aspect of the present invention, there is provided a sound reproduction device including: a first loudspeaker; a second loudspeaker; a first loudspeaker drive section for driving the first and second loudspeakers, the first loudspeaker drive section driving the first and second loudspeakers at substantially the same phase in a first frequency band, and the first loudspeaker drive section driving the first and second loudspeakers at substantially inverse phase and substantially different amplitude levels in a second frequency band higher than the first frequency band.

In one embodiment of this invention, the first loudspeaker drive section processes a first sound signal so as to output to the first loudspeaker a first drive signal for driving the first loudspeaker, and processes a second sound signal so as to output to the second loudspeaker a second drive signal for driving the second loudspeaker, the first loudspeaker drive section including: a phase difference control section for controlling a difference in phase between the first and second drive signals so as to be in the vicinity of 0° in the first frequency band and in the vicinity of 180° in the second frequency band; and a gain difference control section for controlling a difference in gain between the first and second drive signals so as to be equal to or more than a prescribed value in a frequency band including at least the second frequency band.

In another embodiment of this invention, the phase difference control section controls the difference in phase between the first and second drive signals so as to vary between 0° and 180° in a transition frequency band substantially provided between the first and second frequency bands.

In still another embodiment of this invention, the first loudspeaker drive section includes a filter for filtering one of the first and second sound signals and an amplifier for amplifying the other one of the first and second sound signals, the filter has a frequency phase characteristic for changing a phase of an input signal according to a frequency of the input signal, and the filter functions as the phase difference control section and the amplifier functions as the gain difference control section.

In still another embodiment of this invention, the first loudspeaker drive section includes a filter for filtering one of the first and second sound signals and an amplifier for amplifying an output of the filter, the filter has a frequency phase characteristic for changing a phase of an input signal according to a frequency of the input signal, and the filter functions as the phase difference control section and the amplifier functions as the gain difference control section.

In still another embodiment of this invention, the first loudspeaker drive section includes a filter for filtering one of the first and second sound signals, the filter has a frequency phase characteristic for changing a phase of an input signal according to a frequency of the input signal and a frequency gain characteristic for maintaining a gain which is non-zero and substantially constant with respect to the input signal regardless of the frequency of the input signal, and the filter functions as both the phase difference control section and the gain difference control section.

In still another embodiment of this invention, the first and second sound signals are obtained by distributing a monaural signal in prescribed proportions.

In still another embodiment of this invention, an interval between respective positions at which the first and second loudspeakers are provided is less than 17 cm.

In still another embodiment of this invention, the sound reproduction device is used in a mobile terminal apparatus.

In still another embodiment of this invention, the sound reproduction device further includes: a third speaker; and a second loudspeaker drive section for driving the first loudspeaker, the second loudspeaker and the third loudspeaker, wherein the first loudspeaker drive section drives the first and second loudspeakers so as to have first directional characteristics, the second loudspeaker drive section drives the first loudspeaker, the second loudspeaker and the third loudspeaker so as to have second directional characteristics, and the first and second directional characteristics are different from each other.

In still another embodiment of this invention, the second loudspeaker drive section includes: a first filter section connected to the first loudspeaker; a second filter section connected to the second loudspeaker; and a third filter section connected to the third loudspeaker, wherein at least two of a first filter coefficient of the first filter section, a second filter coefficient of the second filter section and a third filter coefficient of the third filter section are different from each other.

In still another embodiment of this invention, the second loudspeaker drive section includes: a first filter section connected to the first and second loudspeakers; and the third filter section connected to the third loudspeaker, wherein the first filter coefficient of the first filter section and the third filter coefficient of the third filter section are different from each other.

In still another embodiment of this invention, the sound reproduction device further includes: an acoustic tube for transmitting sound output by the first loudspeaker to the outside of the sound reproduction device; and a second loudspeaker drive section for driving the first and second loudspeakers, wherein the first loudspeaker drive section drives the first and second loudspeakers so as to have first directional characteristics, the second loudspeaker drive section drives the first loudspeaker and the second loudspeaker so that the acoustic tube and the second loudspeaker have second directional characteristics, and the first and second directional characteristics are different from each other.

According to another embodiment of the present invention, there is provided a mobile terminal apparatus including: a sound reproduction device including a first loudspeaker, a second loudspeaker, a third loudspeaker and first and second loudspeaker drive sections; a drive determination section for determining whether to drive the first loudspeaker drive section or the second loudspeaker drive section; a signal generation section for generating a sound signal; and a switching section for performing a switching operation so as to output the sound signal generated by the signal generation section to the first loudspeaker drive section or the second loudspeaker drive section according to a determination result of the drive determination section, the first loudspeaker drive section driving the first and second loudspeakers so as to have first directional characteristics, the first loudspeaker drive section driving the first and second loudspeakers at substantially the same phase in a first frequency band, the first loudspeaker drive section driving the first and second loudspeakers at substantially inverse phase and substantially different amplitude levels in a second frequency band higher than the first frequency band, the second loudspeaker drive section driving the first loudspeaker, the second loudspeaker and the third loudspeaker so as to have second directional characteristics, and the first and second directional characteristics being different from each other.

Thus, the invention described herein makes possible the advantage of providing a sound reproduction device which can appropriately drive a plurality of loudspeakers positioned close to each other.

These and other advantages of the present invention will become apparent to those skilled in the art upon reading and understanding the following detailed description with reference to the accompanying figures.

DESCRIPTION OF THE EMBODIMENTS

In order to examine methods for driving a plurality of loudspeakers positioned close to each other, the present inventors conducted experiments with respect to two driving methods (i.e., a method for same-phase driving two loudspeakers and a method for inverse-phase driving two loudspeakers).

Figure 1:
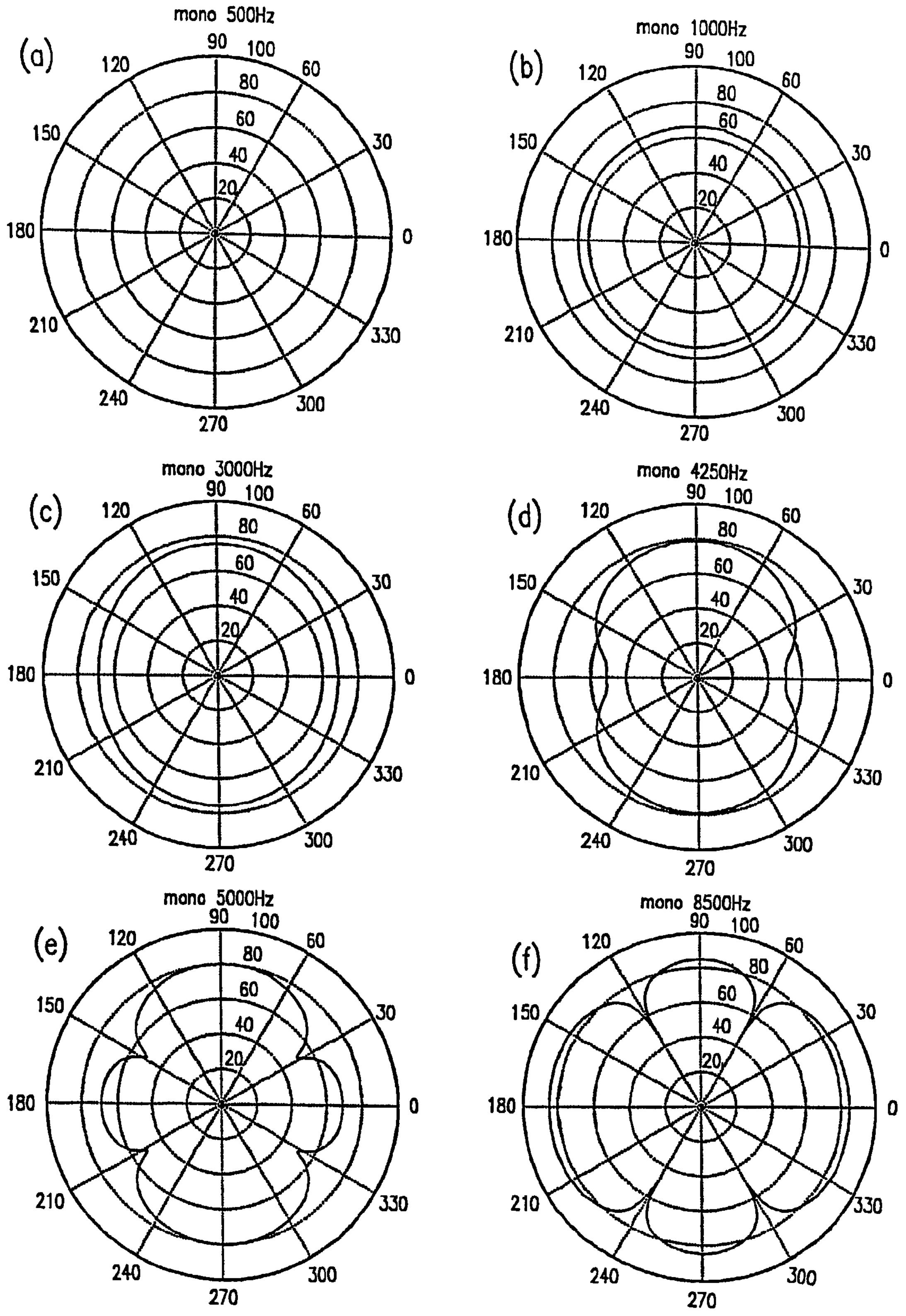
FIG. 1 is a diagram showing directional characteristics of two loudspeakers measured in experiments in the case where the two loudspeakers are same-phase driven.

FIG. 1 shows directional characteristics of two loudspeakers measured in experiments in the case where the two loudspeakers are same-phase driven (i.e., driven with signals having the same phase). Here, the experimental conditions are as follows: distance between two loudspeakers: four centimeters (cm); input signals to the two loudspeakers: two signals obtained by distributing a monaural sound signal in equal proportions; and target of measurement: relative sound pressure on a circle having a radius of 50 cm and the center which is the midpoint of a line extending between the two loudspeakers.

In FIG. 1, each experimental result is indicated by a solid line on a circular chart having the midpoint of a line extending between the two loudspeakers as the origin. It should be noted that the line extending between the two loudspeakers is assumed to be present on a 0°–180° line shown in FIG. 1.

FIG. 1(*a*) shows an experimental result in the case where a signal frequency is 500 Hz, FIG. 1(*b*) shows an experimental result in the case where the signal frequency is 1000 Hz, FIG. 1(*c*) shows an experimental result in the case where the signal frequency is 3000 Hz, FIG. 1(*d*) shows an experimental result in the case where the signal frequency is 4250 Hz, FIG. 1(*e*) shows an experimental result in the case where the signal frequency is 5000 Hz, and FIG. 1(*f*) shows an experimental result in the case where the signal frequency is 8500 Hz.

From FIGS. 1(*a*) and 1(*b*), it is appreciated that the solid lines on the circular charts are almost circular in the case where the frequencies are 500 Hz and 1000 Hz. This indicates that approximately equivalent relative sound pressures are obtained in any direction in the range from 0° to 360°.

From FIGS. 1(*c*) and 1(*d*), it is appreciated that when the signal frequency reaches 3000 Hz, the relative sound pressure in the 0°–180° direction gradually becomes lower, and in the case where the signal frequency is 4250 Hz, large dips occur to the directional characteristic of the loudspeakers.

From FIGS. 1(*e*) and 1(*f*), it is appreciated that as the signal frequency becomes higher, the dips migrate toward a 90°–270° direction.

Such dips appear when a difference in phase between two signals output from their respective two loudspeakers becomes 180° at an observation point. Since an interval between the two loudspeakers is four centimeters, the dips occur in the 0°–180° direction under the condition that four centimeters correspond to half a wavelength. Accordingly, in the case where the sound velocity is 340 m/s, calculations suggest that the dips occur when the signal frequency is 4250 Hz. In fact, in the experiments, the dips occurred in the 0°–180° direction when the frequency is 4250 Hz (see FIG. 1(*d*)). It should be noted that the reason that the depths of the dips do not become $-\infty$ dB is because a difference in length of paths between the observation point and the two loudspeakers results in a difference in attenuation of amplitudes. The depths of the dips become greater the farther the observation point is positioned away from the two loudspeakers. This is because the farther the observation point is positioned away from the two loudspeakers, the smaller a difference in sound pressure between the two loudspeakers becomes at the observation point.

Therefore, in the case where the two loudspeakers are same-phase driven, it is appreciated that the dips occur to the directional characteristic of the two loudspeakers depending on the interval between the two loudspeakers.

Equal-loudness level contours for pure tones and hearing thresholds are measured with respect to a human hearing characteristic. More specifically, pure tones of 1000 Hz at every 10 dB are used as a reference, and sound pressure levels of pure tones at another frequency where sounds can be heard as loud as at sound pressure levels of the reference pure tones are measured so as to be plotted as the contours.

Figure 2:
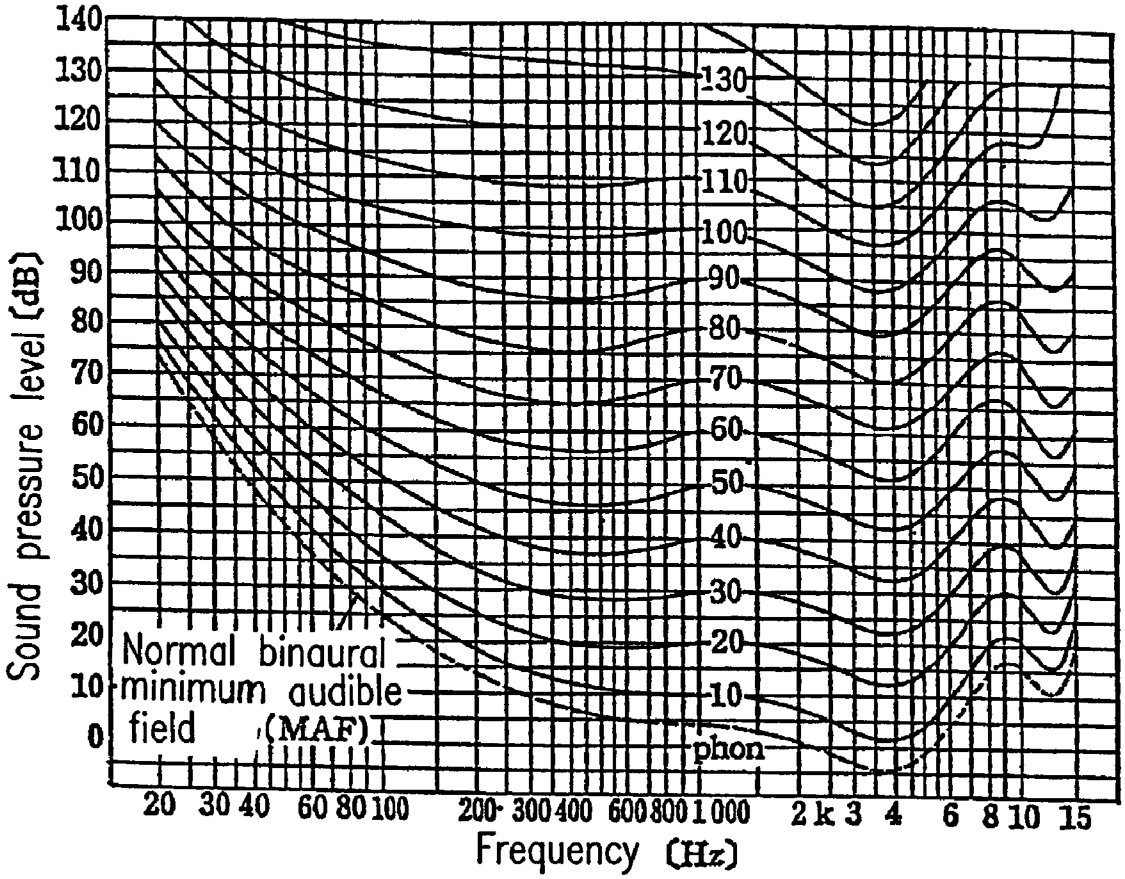
FIG. 2 shows equal-loudness level contours for pure tones and hearing thresholds in a free sound field.

FIG. 2 shows equal-loudness level contours for pure tones and hearing thresholds in a free sound field, which appeared in a treatise by D. W. Robinson and R. S. Dadson, "A redetermination of the equal-loudness relations for pure tones", British Journal of Applied Physics, 7, 166–181 (1956). It should be noted that FIG. 2 is quoted from Corona Publishing Co., Ltd., "KISO ONKYO KOGAKU (Basic Acoustical Engineering)", edited by The Acoustical Society of Japan, p. 18.

From FIG. 2, it is appreciated that human hearing sensitivity is high in a range between about 400 Hz and about 4 kHz. This indicates that in the case where an interval between two loudspeakers is four centimeters and the two loudspeakers are same-phase driven, dips, which occur in a 0°–180° direction, are particularly easily perceivable in view of the human hearing characteristic and a tone color is likely to vary depending on the position of a listener.

Figure 3:
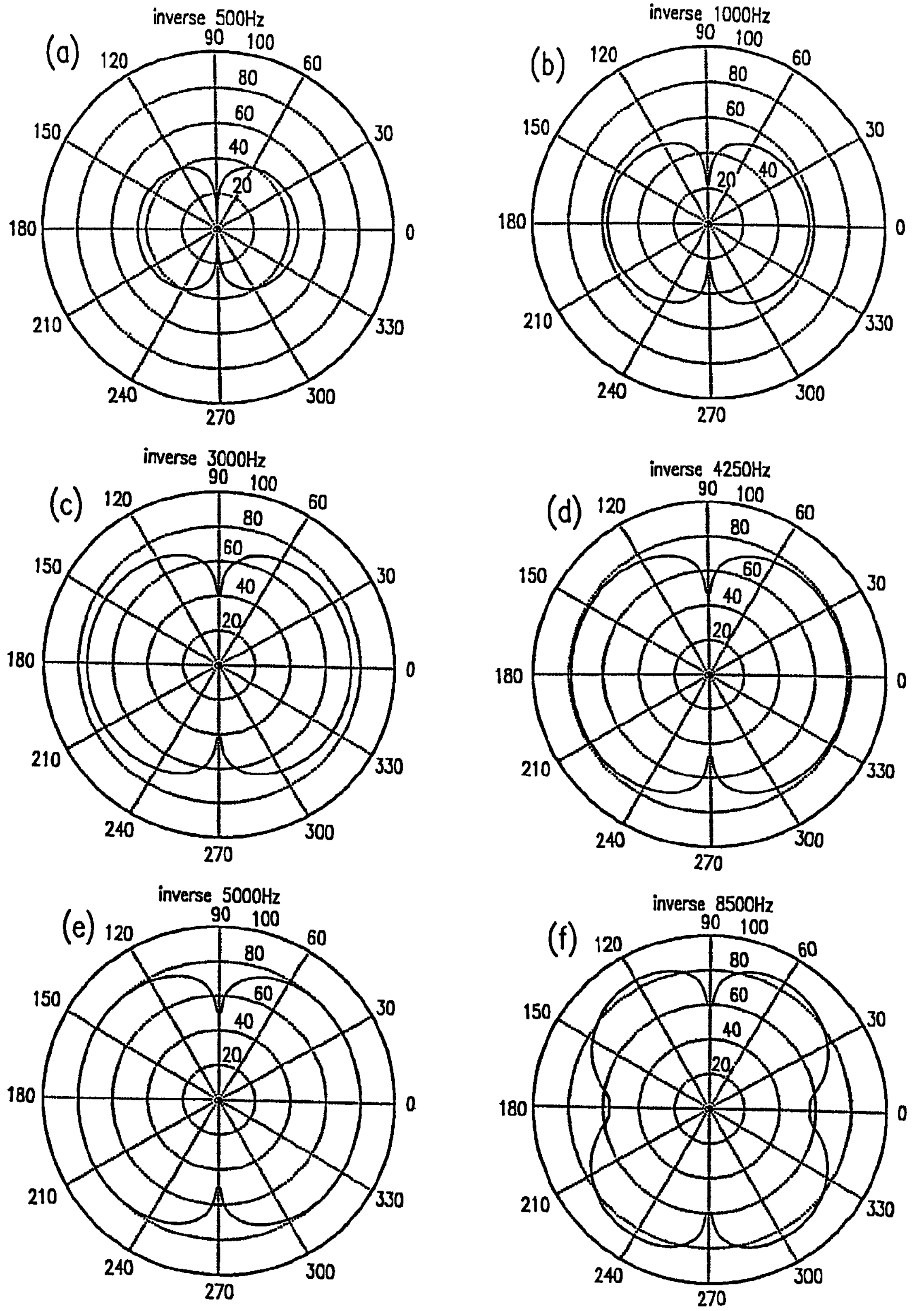
FIG. 3 is a diagram showing directional characteristics of two loudspeakers measured in experiments in the case where the two loudspeakers are inverse-phase driven.

FIG. 3 shows directional characteristics of two loudspeakers measured in experiments in the case where the two loudspeakers are inverse-phase driven (i.e., driven with signals having an inverse phase relationship). Here, experimental conditions are the same as those described above in relation to FIG. 1.

FIG. 3(*a*) shows an experimental result in the case where a signal frequency is 500 Hz, FIG. 3(*b*) shows an experimental result in the case where the signal frequency is 1000 Hz, FIG. 3(*c*) shows an experimental result in the case where the signal frequency is 3000 Hz, FIG. 3(*d*) shows an experimental result in the case where the signal frequency is 4250 Hz, FIG. 3(*e*) shows an experimental result in the case where the signal frequency is 5000 Hz, and FIG. 3(*f*) shows an experimental result in the case where the signal frequency is 8500 Hz.

From FIGS. 3(*a*)–3(*f*), it is appreciated that dips are present in a 90°–270° direction across all the frequency bands. This is because in the case where the two loudspeakers are inverse-phase driven, sound pressures from the two loudspeakers completely counteract each other at an observation point positioned at equal distance from the two loudspeakers regardless of the frequency band.

By making comparisons between FIGS. 3(*a*) and 1(*a*) and between FIGS. 3(*b*) and 1(*b*), it is appreciated that in the case where the two loudspeakers are inverse-phase driven, the sound pressures in a low frequency band are reduced in every direction as compared to the case where the two loudspeakers are same-phase driven. This is due to the fact that phase difference $\theta_d$ of signals observed at the observation point becomes smaller the lower the frequency becomes.

Phase difference $\theta_d$ between signals observed at the observation point is represented by expression 1, $$\theta_d = 2*\pi*l_d/(340/f) \quad (1),$$

where $l_d$ denotes path difference and f denotes frequency.

In the low frequency band, phase difference $\theta_d$ becomes unsusceptible to path difference $l_d$, and phase difference $\theta_d$ becomes smaller the lower frequency f becomes. Therefore, when the two loudspeakers are inverse-phase driven in the low frequency band, the phases of signals observed at the observation point approximate inverse phases. Further, since path difference $l_d$ is small, the sound pressures from the two loudspeakers are substantially equivalent to each other at the observation point. Therefore, in the low frequency band, a sound pressure obtained as a synthesis of outputs of the two loudspeakers is low.

By making a comparison between FIGS. 3(*d*) and 1(*d*), it is appreciated that in the case where the two loudspeakers are inverse-phase driven, the dips, which occurred in the 0°–180° direction at the frequency of 4250 Hz in the case where the two loudspeakers are same-phase driven (FIG. 1(*d*)), are not present. The reason for this is that since the two loudspeakers are inverse-phase driven, the dips occur in the 0°–180° direction under the condition that the frequency is 8500 Hz where four centimeters corresponds to the wavelength rather than 4250 Hz where four centimeters corresponds to half the wavelength. In fact, in the experiments, the dips occurred in the 0°–180° direction when the signal frequency was 8500 Hz (see FIG. 3(*f*)).

The following is a summary of the experimental results of two driving methods (i.e., a method for same-phase driving two loudspeakers and a method for inverse-phase driving the two loudspeakers).

In the case where the two loudspeakers are same-phase driven, the dips occur in the 0°–180° direction in a frequency band in the vicinity of 4250 Hz. This is a frequency band which corresponds to a highly sensitive area in a human hearing characteristic and in which tone color varies depending on the position of a listener. Further, variance in tone color becomes more obvious the farther the position at which the listener hears the sound is provided away from the two loudspeakers.

In the case where the two loudspeakers are inverse-phase driven, the dips occur in the 90°–270° direction. Further, there is a problem that the sound pressures in the low frequency band are reduced in every direction. However, there is an advantage that the frequency at which the dips occur in the 0°–180° direction is 8500 Hz which corresponds to a less sensitive area in a human hearing characteristic, as compared to the case where the two loudspeakers are same-phase driven (see FIG. 2).

Hereinafter, embodiments of the present invention will be described with reference to the accompanying drawings.

1. An Example of a Structure of a Mobile Terminal Apparatus 1

Figure 4:
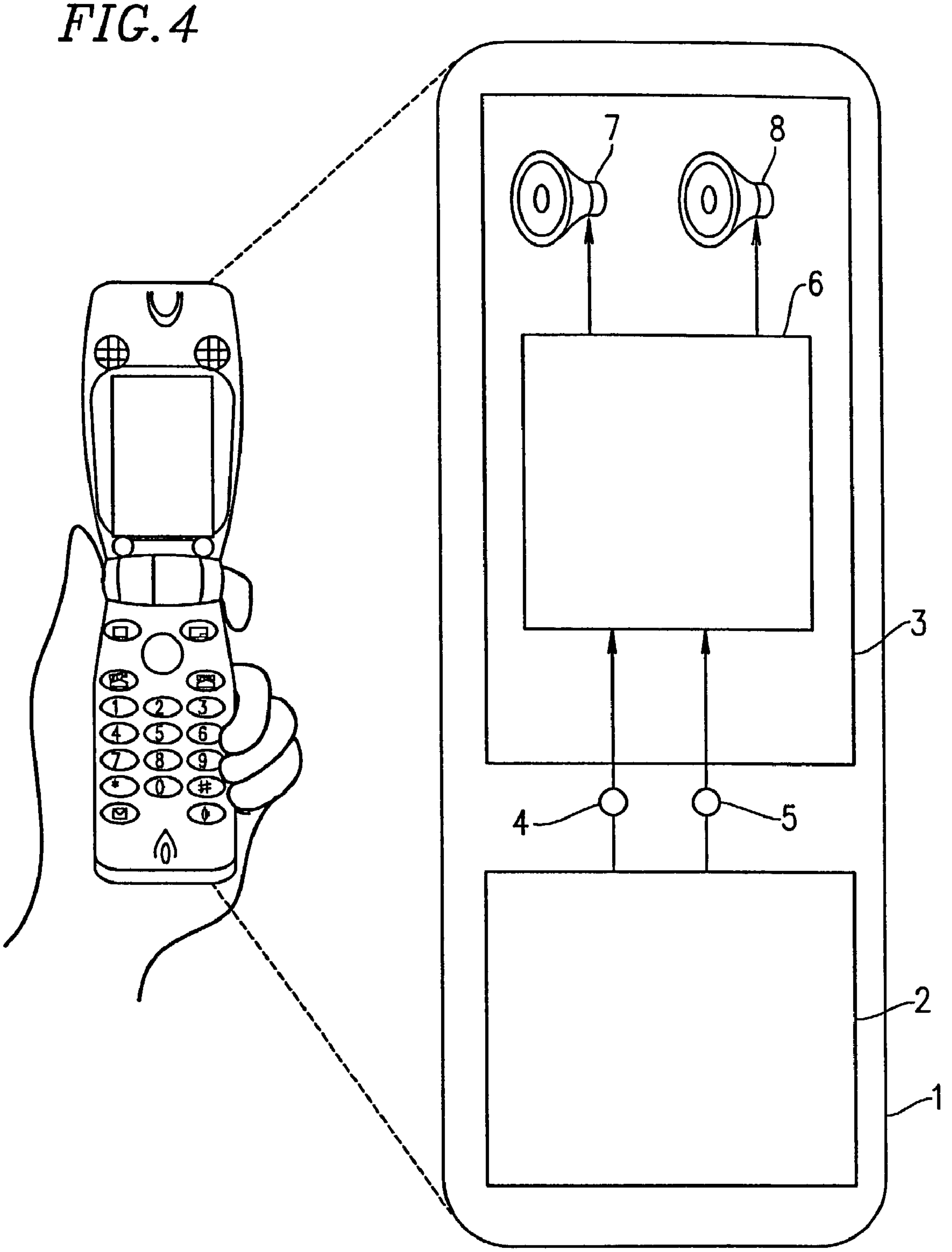
FIG. 4 is a diagram showing an example of a structure of a mobile terminal apparatus 1 according to an embodiment of the present invention.

FIG. 4 shows an example of a structure of a mobile terminal apparatus 1 according to an embodiment of the present invention.

For example, the mobile terminal apparatus 1 is a cellular phone. Alternatively, the mobile terminal apparatus 1 can be any type of mobile terminal apparatus (e.g., PHS, PDA, etc.) other than a cellular phone, and can be a loudspeaker apparatus.

The mobile terminal apparatus 1 includes a main processing section 2 and a sound reproduction device 3. The main processing section 2 performs speech processing and the like. When reproducing sound such as a ringtone or music, the main processing section 2 generates first and second sound signals. The first sound signal is input to the sound reproduction device 3 via an input terminal 4. The second sound signal is input to the sound reproduction device 3 via an input terminal 5.

It should be noted that the first and second sound signals can be monaural signals or signals obtained by distributing a monaural signal in prescribed proportions (e.g., equal proportions). Alternatively, the first sound signal can be a left channel signal of a stereo format and the second sound signal can be a right channel signal of a stereo format.

The sound reproduction device 3 includes a loudspeaker 7 (a first loudspeaker), a loudspeaker 8 (a second loudspeaker), and a loudspeaker drive section 6 (a first loudspeaker drive section) for driving the loudspeakers 7 and 8. In the example shown in FIG. 4, although the loudspeakers 7 and 8 are provided in the mobile terminal apparatus 1, at least one of the loudspeakers 7 and 8 is not necessarily provided in the mobile terminal apparatus 1. It should be noted that an interval between respective positions at which the loudspeakers 7 and 8 are provided is preferably less than 17 cm. This allows a lowest frequency at which a dip occurs to be about 1 kHz, whereby expected effects of the present invention can be achieved.

The loudspeaker drive section 6 receives the first sound signal input to the sound reproduction device 3 and processes the received first sound signal so as to drive the loudspeaker 7. The first sound signal processed in such a manner is output to the loudspeaker 7 as a first drive signal for driving the loudspeaker 7. The loudspeaker driving section 6 receives the second sound signal input to the sound reproduction device 3 and processes the received second sound signal so as to drive the loudspeaker 8. The second sound signal processed in such a manner is output to the loudspeaker 8 as a second drive signal for driving the loudspeaker 8.

The loudspeaker drive section 6 drives the loudspeakers 7 and 8 at substantially the same phase in a low frequency band (first frequency band) and drives the loudspeakers 7 and 8 at substantially inverse phases and substantially different amplitude levels in a high frequency band (second frequency band which is higher than the first frequency band).

The meaning of the wording "substantially the same phase" described herein includes, in addition to a case where the phases are completely the same as each other, a range in which the phases are not completely the same as each other but can be considered as being the same in a normal range of design. Likewise, the meaning of the wording "substantially inverse phase" includes, in addition to a case where the phases are completely inverse to each other, a range in which the phases are not completely inverse to each other but can be considered as being inverse in a normal range of design.

In this manner, by driving the loudspeakers 7 and 8 at substantially the same phase in the low frequency band and driving the loudspeakers 7 and 8 at substantially inverse phase in the high frequency band, it is possible to employ the advantages of the same-phase driving and the inverse-phase driving and complement the respective defects of the same-phase driving and the inverse-phase driving. As a result, it is possible to simultaneously solve the problem caused in the case of the same-phase driving that the dips occur in the 0°–180° direction in the frequency band in the vicinity of 4250 Hz and the problem caused in the case of the inverse-phase driving that the sound pressures in the low frequency band are reduced in every direction.

Further, by driving the loudspeakers 7 and 8 at different amplitude levels in the high frequency band, it is possible to solve the problem caused in the case of the inverse-phase driving that the dips occur in the 90°–270° direction.

It should be noted that a transition frequency band can be present between the low and high frequency bands. In the transition frequency band, the loudspeaker drive section 6 drives the loudspeakers 7 and 8 so as to make a transition from the same phases to the inverse phases or from the inverse phases to the same phases.

Figure 5:
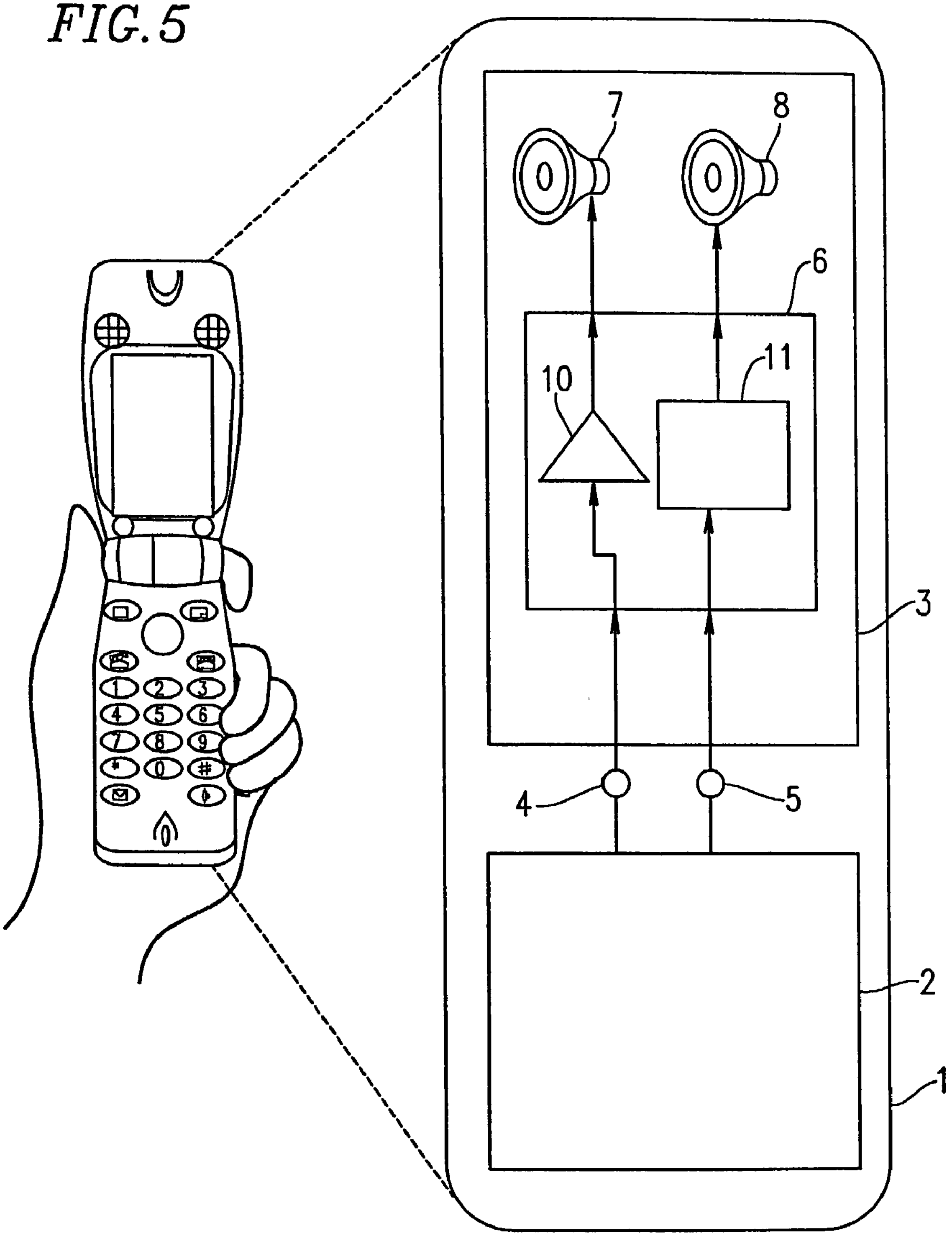
FIG. 5 is a diagram showing an example of a structure of a loudspeaker drive section 6 according to the present invention.

FIG. 5 shows an example of a structure of the loudspeaker drive section 6.

The loudspeaker drive section 6 includes a multiplier 10 for generating the first drive signal by multiplying the first sound signal by a prescribed multiplier coefficient, and a filter 11 for generating the second drive signal by filtering the second sound signal using a prescribed filter coefficient.

Figure 6:
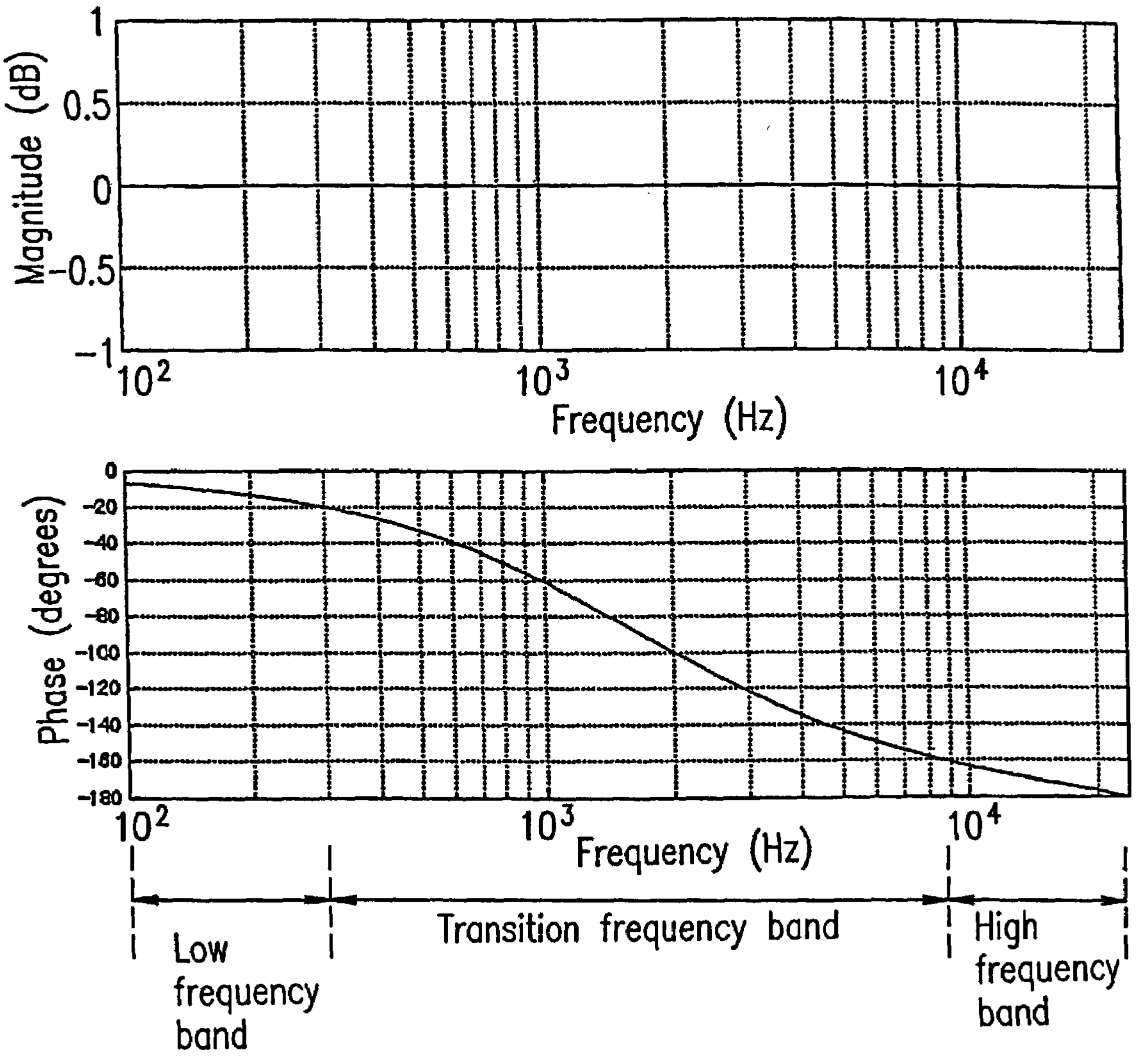
FIG. 6 shows a frequency gain characteristic and a frequency phase characteristic of a filter 11 according to the present invention.

FIG. 6 shows a frequency gain characteristic and a frequency phase characteristic of the filter 11.

The frequency gain characteristic shown in FIG. 6 indicates that a gain for an input signal is zero regardless of the frequency of the input signal. This means that a signal input to the filter 11 is output with the amplitude of the input signal left unchanged (i.e., without an increase or decrease in the amplitude).

In this manner, by providing the frequency gain characteristic so as to be flat, it is possible to allow a change made to a frequency gain characteristic of an original sound to be as little as possible.

The frequency phase characteristic shown in FIG. 6 indicates that the phase of the input signal is changed according to the frequency of the input signal. In the example shown in FIG. 6, although a difference in phase between the signal input to the filter 11 and the signal output from the filter 11 is almost 0° in the low frequency band (e.g., in the vicinity of a frequency of 100 Hz), the difference in phase between the signal input to the filter 11 and the signal output from the filter 11 gradually becomes greater as the frequency is increased, so that the difference in phase between the signal input to the filter 11 and the signal output from the filter 11 becomes almost 180° in the high frequency band (e.g., in the vicinity of a frequency of 10000 Hz).

The filter 11 is a digital filter, for example, an IIR (Infinite Impulse Response) filter, an FIR (Finite Impulse Response) filter, or the like. A transmission function of the digital filter is represented by, for example, expression (2), $$H(z) = \frac{-a + z^{-1}}{1 - az^{-1}}. \tag{2}$$

In order to realize the frequency phase characteristic shown in FIG. 6 using a digital filter, a value of a prescribed filter coefficient (a) indicated in expression 2 can be set so as to be about 0.8. In this case, a sampling frequency is assumed to be 48 kHz.

Further, a value of a prescribed multiplier coefficient in the multiplier 10 can be set so as to be about $10^{4/20}$.

It should be noted that the curve showing the frequency phase characteristic in FIG. 6 is merely an example and is not limited to this. It is possible to control the transition from the same-phase driving to the inverse-phase driving or the transition from the inverse-phase driving to the same-phase driving by changing a transition frequency for determining the extent of the frequency at which the same-phase driving is performed.

As shown in FIG. 5, by using the multiplier 10 so as to process one of the first and second sound signals and using the filter 11 so as to process the other, it is possible to control a difference in gain between the first and second drive signals so as to be equal to or more than a prescribed value (e.g., 4 dB). Further, it is also possible to control a difference in phase between the first and second drive signals so as to be in the vicinity of 0° (e.g., within 0°±20°) in the low frequency band (e.g., a band in the vicinity of 100 Hz) and in the vicinity of 180° (e.g., within 180°±20°) in the high frequency band (e.g., a band in the vicinity of 10000 Hz).

It should be noted that the difference in gain between the first and second drive signals is not always required to be equal to or more than a prescribed value (e.g., 4 dB) across all the frequency bands. The difference in gain between the first and second drive signals is only required to be equal to or more than a prescribed value (e.g., 4 dB) at least in the high frequency band (e.g., a band in the vicinity of 10000 Hz). Further, the difference in gain between the first and second drive signals can be changed for each frequency (or each frequency band). Such a change in the gain difference can be realized by, for example, using a filter or the like which limits a frequency band in which the first or second sound signals are amplified. For example, in the low frequency band where no dip is present in the directional characteristic of the loudspeakers, the difference in gain between the first and second drive signals can be substantially eliminated.

In the example shown in FIG. 5, the multiplier 10 (or an amplifier for amplifying the first sound signal) functions as a gain difference control section for controlling the difference in gain between the first and second drive signals, and the filter 11 functions as a phase difference control section for controlling the difference in phase between the first and second drive signals.

Figure 7:
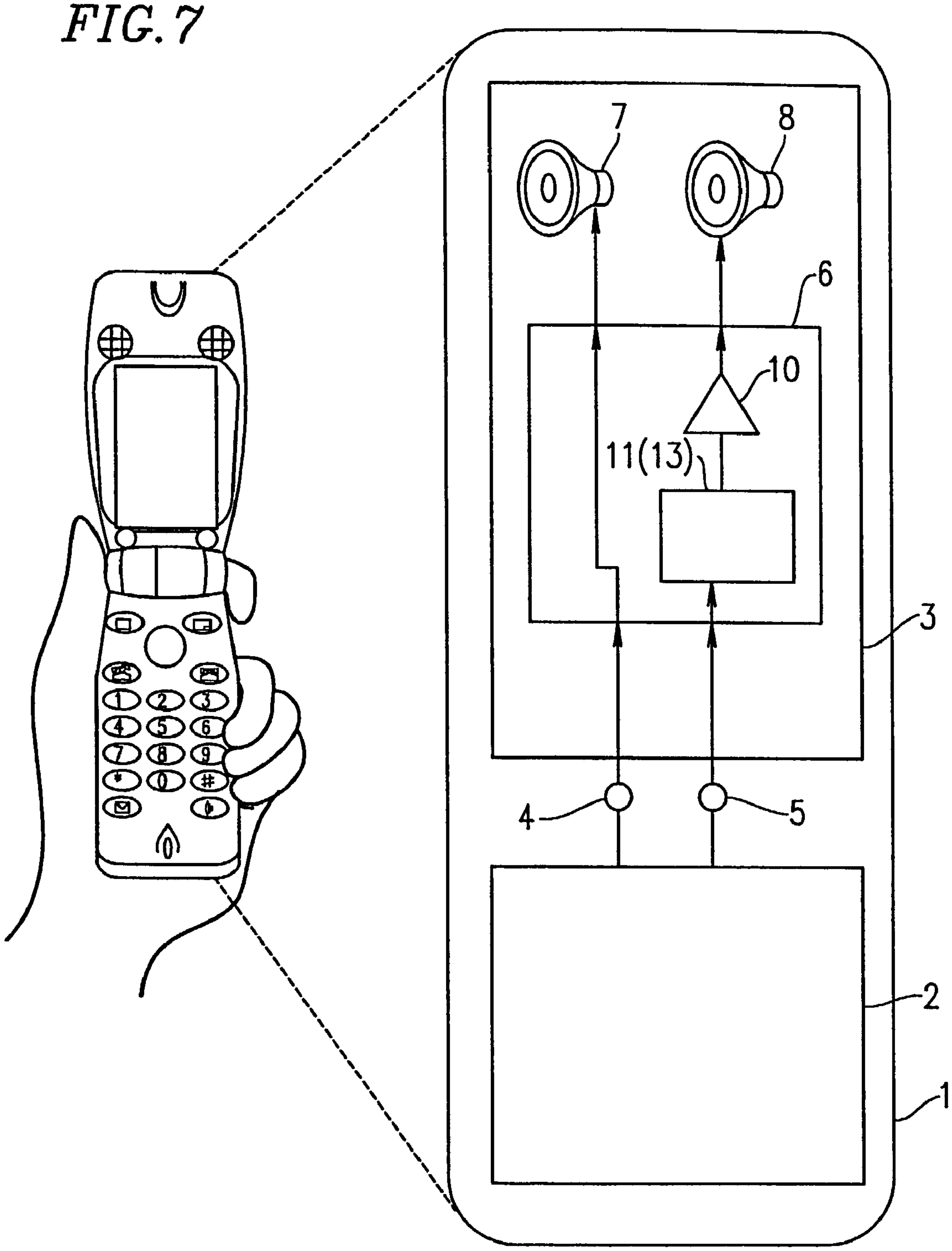
FIG. 7 is a diagram showing another example of a structure of the loudspeaker drive section 6 according to the present invention.

FIG. 7 shows another example of a structure of the loudspeaker drive section 6.

The loudspeaker drive section 6 includes the filter 11 for filtering the second sound signal using a prescribed filter coefficient, and the multiplier 10 for generating the first drive signal by multiplying an output of the filter 11 by a prescribed multiplier coefficient.

The structure of the loudspeaker drive section 6 shown in FIG. 7 is identical to that of the loudspeaker drive section 6 shown in FIG. 5 except that the position of the multiplier 10 is changed. In order to provide the difference in gain between the first and second drive signals so as to be equal to or more than a prescribed value (e.g., 4 dB), a signal on a channel in which the filter 11 is provided can be amplified or a signal on a channel which is different from the channel in which the filter 11 is provided can be amplified.

In the example shown in FIG. 7, the multiplier 10 (or an amplifier for amplifying an output of the filter 11) functions as a gain difference control section for controlling the difference in gain between the first and second drive signals, and the filter 11 functions as a phase difference control section for controlling a difference in phase between the first and second drive signals.

Further, in the example shown in FIG. 7, it is possible to omit the multiplier 10 by replacing the filter 11 with a filter 13. This makes it possible to realize the loudspeaker drive section 6 with a more simple circuit structure. Here, the filter 13 is assumed to have a prescribed filter coefficient corresponding to a result obtained by multiplying a prescribed filter coefficient in the filter 11 by a prescribed multiplier coefficient in the multiplier 10. The filter 13 is a digital filter, for example, an IIR filter, an FIR filter, or the like. The transmission function of the digital filter is represented by, for example, expression (3), $$H(z) = \frac{-ga + gz^{-1}}{1 - az^{-1}}, \tag{3}$$

where g denotes a coefficient equivalent to the prescribed multiplier coefficient in the multiplier 10.

The filter 13 can be any type of filter having a frequency phase characteristic for changing the phase of an input signal according to the frequency of the input signal and a frequency gain characteristic for maintaining a gain which is non-zero and substantially constant with respect to the input signal regardless of the frequency of the input signal. In this case, the filter 13 functions as the phase difference control section for controlling the difference in phase between the first and second drive signals and the gain difference control section for controlling the difference in gain between the first and second drive signals. It should be noted that the filter 13 can have a frequency gain characteristic for maintaining a gain which is non-zero and substantially constant with respect to an input signal in a high frequency band among other input signals.

Further, the above-described filter 11 (or filter 13) can be realized using an analog circuit including an op-amp or the like. A similar effect to that described above can be achieved by this structure.

Figure 8:
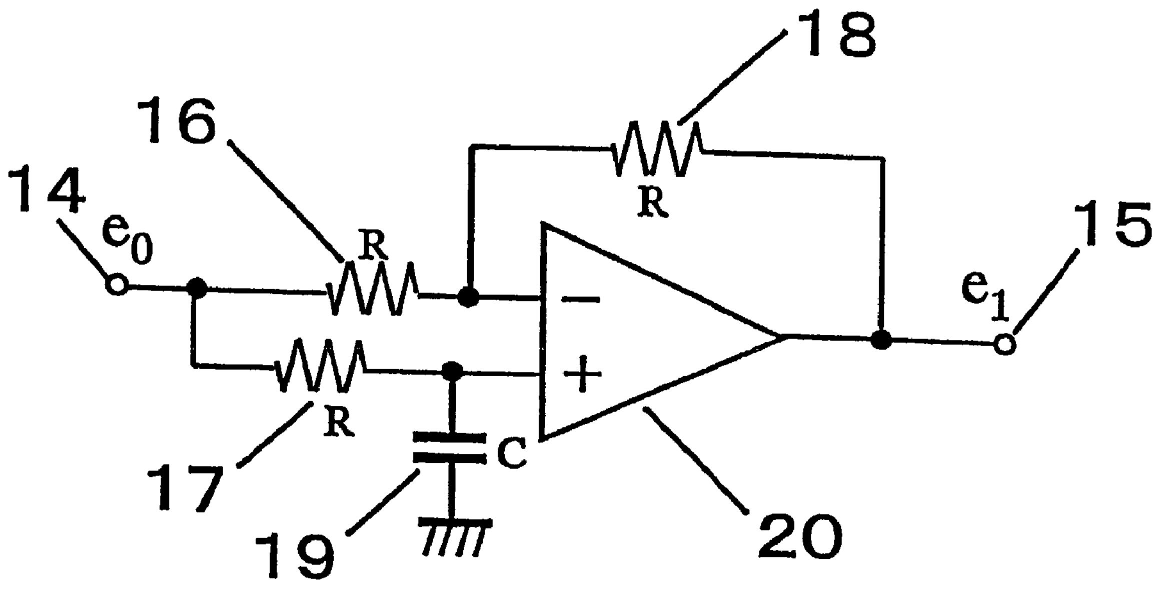
FIG. 8 is a diagram showing an example of a circuit structure of the filter 11 of FIG. 6 in the case where the filter 11 is realized using an analog circuit.

FIG. 8 shows an example of a circuit structure of the filter 11 in the case where the filter 11 is realized using an analog circuit.

In FIG. 8, reference numeral 14 denotes an input terminal, reference numeral 15 denotes an output terminal, reference numerals 16–18 denote resistors, reference numeral 19 denotes a capacitor, and reference numeral 20 denotes an op-amp. Here, in the case where respective values of resistance of the resistors 16–18 are R, capacitance of the capacitor 19 is C, a voltage at the input terminal 14 is $e_0$, and a voltage at the output terminal 15 is $e_1$. A frequency characteristic in between the voltages $e_0$ and $e_1$ is represented by, for example, expression (4), $$e_1 = \frac{1 - j\omega CR}{1 + j\omega CR} e_0, \tag{4}$$

where ω denotes an angular frequency.

Phase characteristic θ of a signal is represented by expression (5), $$\theta = -\arctan\left(\frac{2\omega CR}{1 - (\omega CR)^2}\right). \tag{5}$$

From expression (5), it is appreciated that a phase is changed along with a frequency. It is also appreciated that the phase characteristic can be changed by changing the capacitance of the capacitor or values of the resistance of the resistors. In this manner, a filter can be realized using an analog circuit.

It should be noted that the filter 11 (or filter 13) preferably has a phase-shift filter characteristic for preventing a reduction in a sound power characteristic due to an interval of the loudspeakers in a frequency band from 1 kHz to 10 kHz, which corresponds to a highly sensitive area in a human hearing characteristic.

Figure 9:
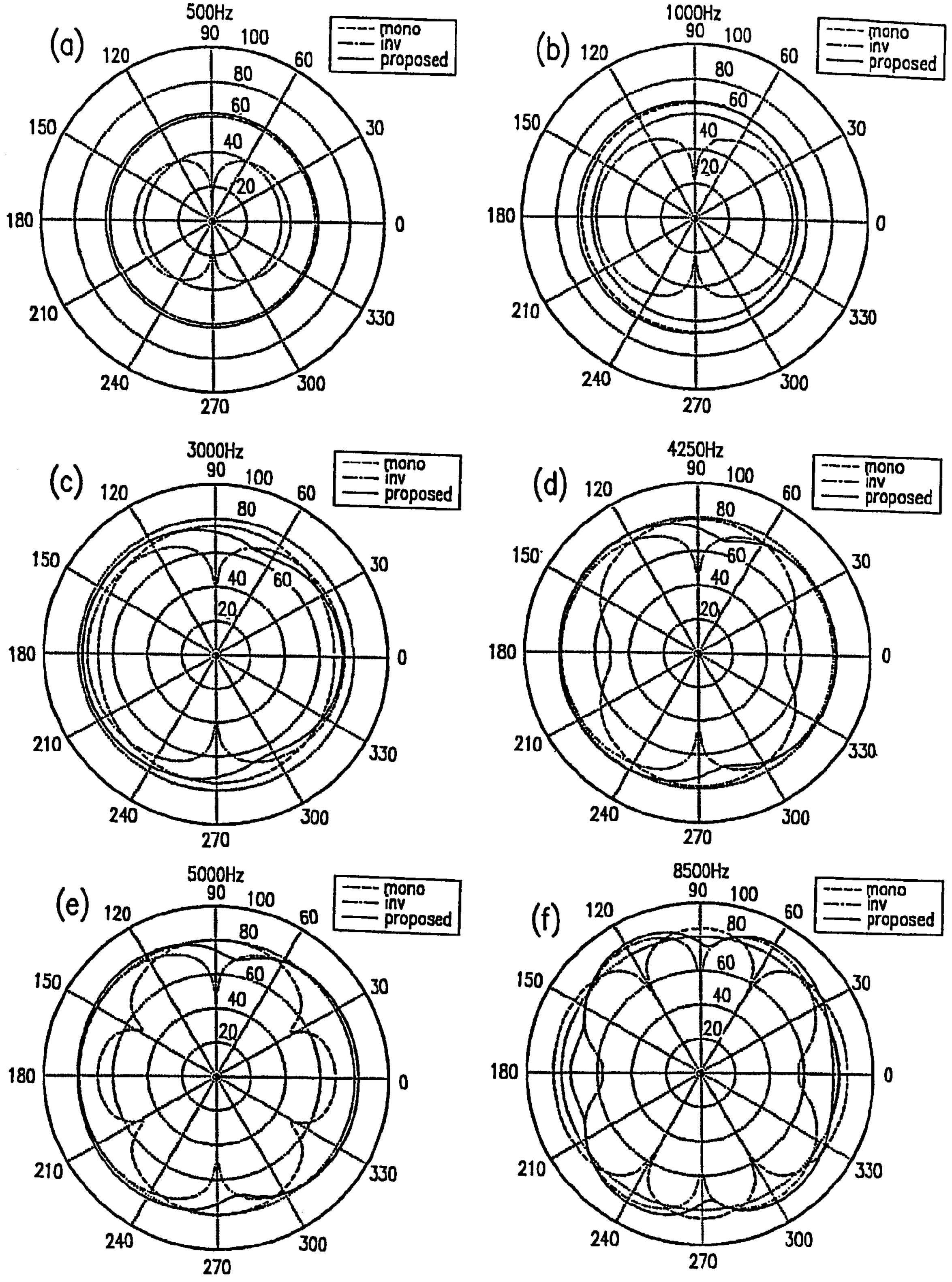
FIG. 9 is a diagram showing directional characteristics of loudspeakers 7 and 8 of a sound reproduction device 3 of FIG. 4.

FIG. 9 shows the directional characteristics of the loudspeakers 7 and 8 in the sound reproduction device 3. In FIG. 9, solid lines indicate results of driving the loudspeakers 7 and 8 using the loudspeaker drive section 6 having the structure shown in FIG. 5 (a difference in gain between the first and second drive signals is assumed to be 4 dB), broken lines indicate results of same-phase driving the loudspeakers 7 and 8 as comparative examples, and one-dotted chain lines indicate results of inverse-phase driving the loudspeakers 7 and 8 as comparative examples.

FIG. 9(*a*) shows an experimental result in the case where a signal frequency is 500 Hz, FIG. 9(*b*) shows an experimental result in the case where the signal frequency is 1000 Hz, FIG. 9(*c*) shows an experimental result in the case where the signal frequency is 3000 Hz, FIG. 9(*d*) shows an experimental result in the case where the signal frequency is 4250 Hz, FIG. 9(*e*) shows an experimental result in the case where the signal frequency is 5000 Hz, and FIG. 9(*f*) shows an experimental result in the case where the signal frequency is 8500 Hz.

From FIGS. 9(*a*) and 9(*b*), it is appreciated that the results indicated by the solid lines and the results indicated by the broken lines are substantially identical to each other. As the reason for this, it is conceivable that the difference in phase between the first and second drive signals based on the frequency phase characteristic shown in FIG. 6 is small, and therefore the results indicated by the solid lines are substantially equivalent to those obtained in the case of the same-phase driving.

From FIG. 9(*c*), it is appreciated that when the frequency reaches 3000 Hz, the result indicated by the solid line and the result indicated by the broken line begin to slightly differ from each other. As the reason for this, it is conceivable that a frequency band in the vicinity of 3000 Hz is included in a transition frequency band in which the loudspeakers 7 and 8 are not driven by means of either the same-phase driving or the inverse-phase driving.

Further, it is appreciated that as the frequency is increased, the results indicated by the solid lines are gradually approximated to those of the inverse-phase driving.

From FIG. 9(*f*), it is appreciated that when the frequency reaches 8500 Hz, the result indicated by the solid line and the result indicated by the one-dotted chain line become similar to each other. Further, it is appreciated that dips in the 0°–180° direction and those in the 90°–270° direction are shallow in the result indicated by the solid line. As the reason for this, it is conceivable that since the first and second drive signals are processed so as to have the difference in gains, the gain difference exists even if the phases are inversed, so that a reduction in sound pressure is prevented.

Figure 10:
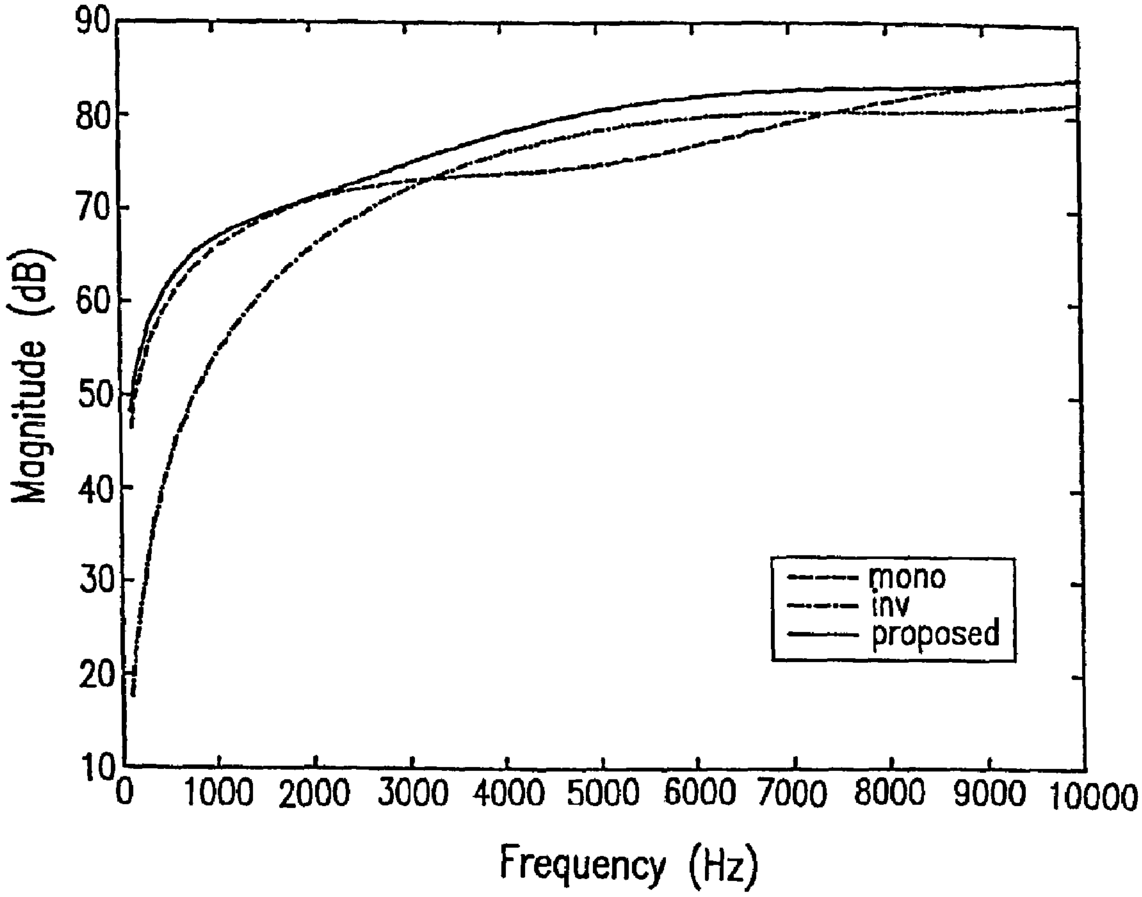
FIG. 10 is a graph showing results of estimating the directional characteristics of the loudspeakers 7 and 8 shown in FIG. 9 for each frequency.

FIG. 10 shows results of estimating the directional characteristics of the loudspeakers 7 and 8 shown in FIG. 9 for each frequency. This is obtained by plotting average values of power of sound pressures at all angles for each frequency.

Similar to FIG. 9, the solid line indicates results of driving the loudspeakers 7 and 8 using the loudspeaker drive section 6 having the structure shown in FIG. 5 (a difference in gain between the first and second drive signals is assumed to be 4 dB), the broken line indicates results of same-phase driving the loudspeakers 7 and 8 as comparative examples, and the one-dotted chain line indicates results of inverse-phase driving the loudspeakers 7 and 8 as comparative examples.

From FIG. 10, it is appreciated that in the case where the present invention is used, the sound pressures are higher across substantially all the frequency bands than those in the conventional cases. This indicates the efficiency of the present invention.

2. Another Example of a Structure of the Mobile Terminal Apparatus 1

A videophone is realized by transmitting/receiving image data along with sound data during hands-free speech. However, secrecy is not ensured in such a videophone. This is because in the case where a normal loudspeaker outputs sounds during the hands-free speech, the sound is transmitted to the surroundings.

In the case where a directional loudspeaker having directivity in a front direction thereof outputs sound, it is possible to reduce the sound transmitted to the surroundings. However, the directional loudspeaker cannot output sound with wide directivity simultaneously with reducing the sound level. This is because the directional loudspeaker having directivity in a front direction thereof has only one specified directional characteristic.

By providing a sound reproduction device described below, it is possible to provide a mobile terminal apparatus in which the loudspeaker is not limited so as to have only one specified directional characteristic.

Figure 11:
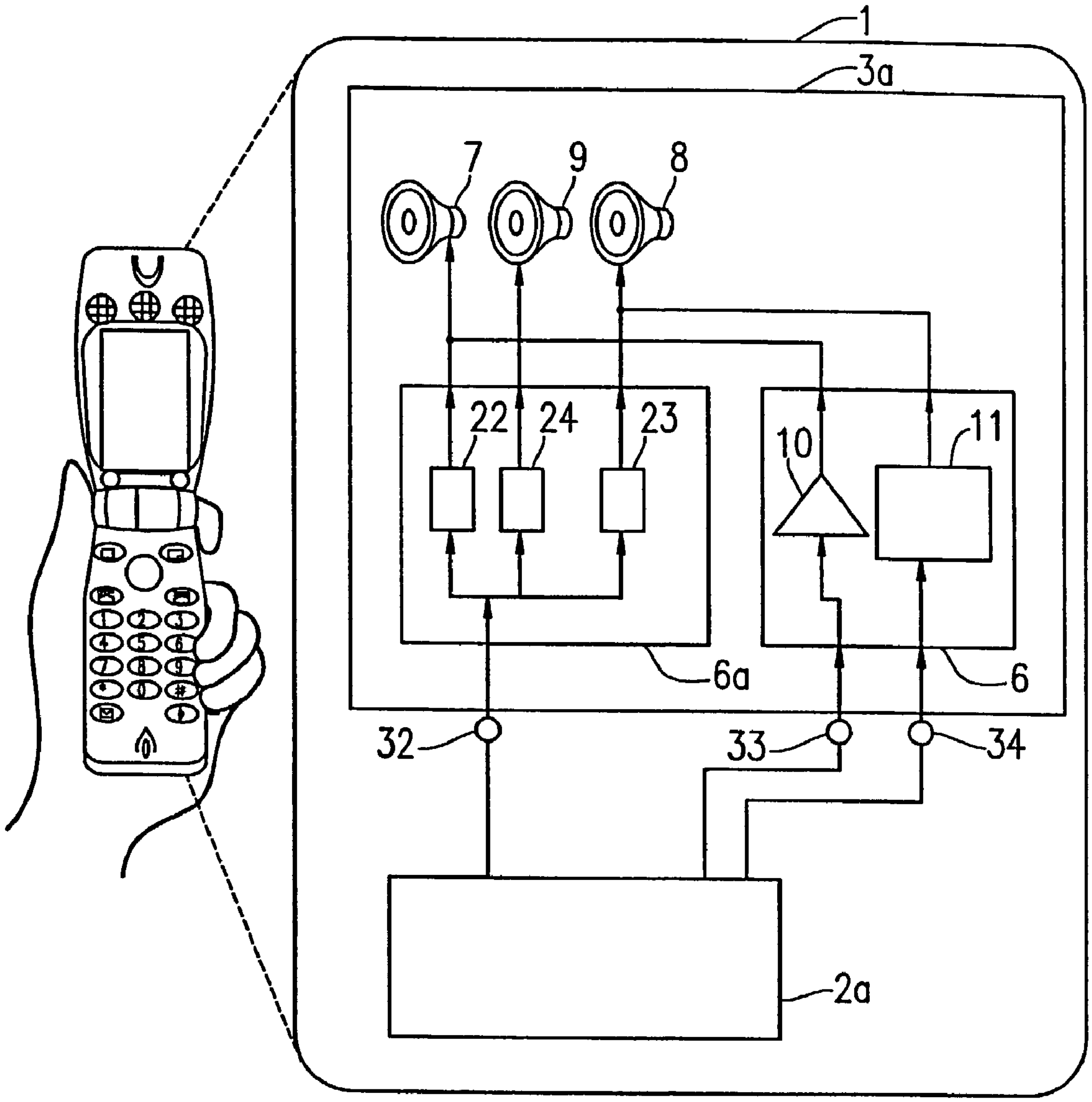
FIG. 11 is a diagram showing another example of a structure of the mobile terminal apparatus 1 according to an embodiment of the present invention.

FIG. 11 shows another example of a structure of the mobile terminal apparatus 1 according to an embodiment of the present invention.

The mobile terminal apparatus 1 includes a main processing section 2*a* (a signal generation section) and a sound reproduction device 3*a*. The main processing section 2*a* performs speech processing and the like. When reproducing sound such as voice or music, the main processing section 2*a* generates a first sound signal, a second sound signal and a third sound signal. The first sound signal is input to the sound reproduction device 3*a* via an input terminal 32. The second sound signal is input to the sound reproduction device 3*a* via an input terminal 33. The third sound signal is input to the sound reproduction device 3*a* via an input terminal 34.

It should be noted that the first sound signal, the second sound signal and the third sound signal can be monaural signals or signals obtained by distributing a monaural signal in prescribed proportions (e.g., equal proportions). Alternatively, the second sound signal can be a left channel signal of a stereo format and the third sound signal can be a right channel signal of a stereo format.

The sound reproduction device 3*a* includes the loudspeaker 7 (first loudspeaker), the loudspeaker 8 (second loudspeaker),a loudspeaker 9 (a third loudspeaker), the loudspeaker drive section 6 (first loudspeaker drive section) for driving the loudspeakers 7 and 8, and a loudspeaker drive section 6*a* (a second loudspeaker drive section) for driving the loudspeakers 7, 8 and 9.

The structure of the loudspeaker drive section 6 shown in FIG. 11 is the same as that of the loudspeaker drive section 6 shown in FIG. 5. Alternatively, the structure of the loudspeaker drive section 6 shown in FIG. 11 can be the same as that of the loudspeaker drive section 6 shown in FIG. 7.

The loudspeaker drive section 6*a* includes a filter 22 (a first filter section), a filter 23 (a second filter section) and a filter 24 (a third filter section). The filter 22 outputs a drive signal to drive the loudspeaker 7 by filtering the first sound signal using a first filter coefficient. The filter 23 outputs a drive signal to drive the loudspeaker 8 by filtering the first sound signal using a second filter coefficient. The filter 24 outputs a drive signal to drive the loudspeaker 9 by filtering the first sound signal using a third filter coefficient. Here, the first filter coefficient, the second filter coefficient and the third filter coefficient are designed such that the corresponding loudspeakers 7, 8 and 9 have desired directional characteristics.

In this manner, the loudspeaker drive section 6*a* drives the loudspeakers 7, 8 and 9 so as to have directional characteristics.

Figure 12:
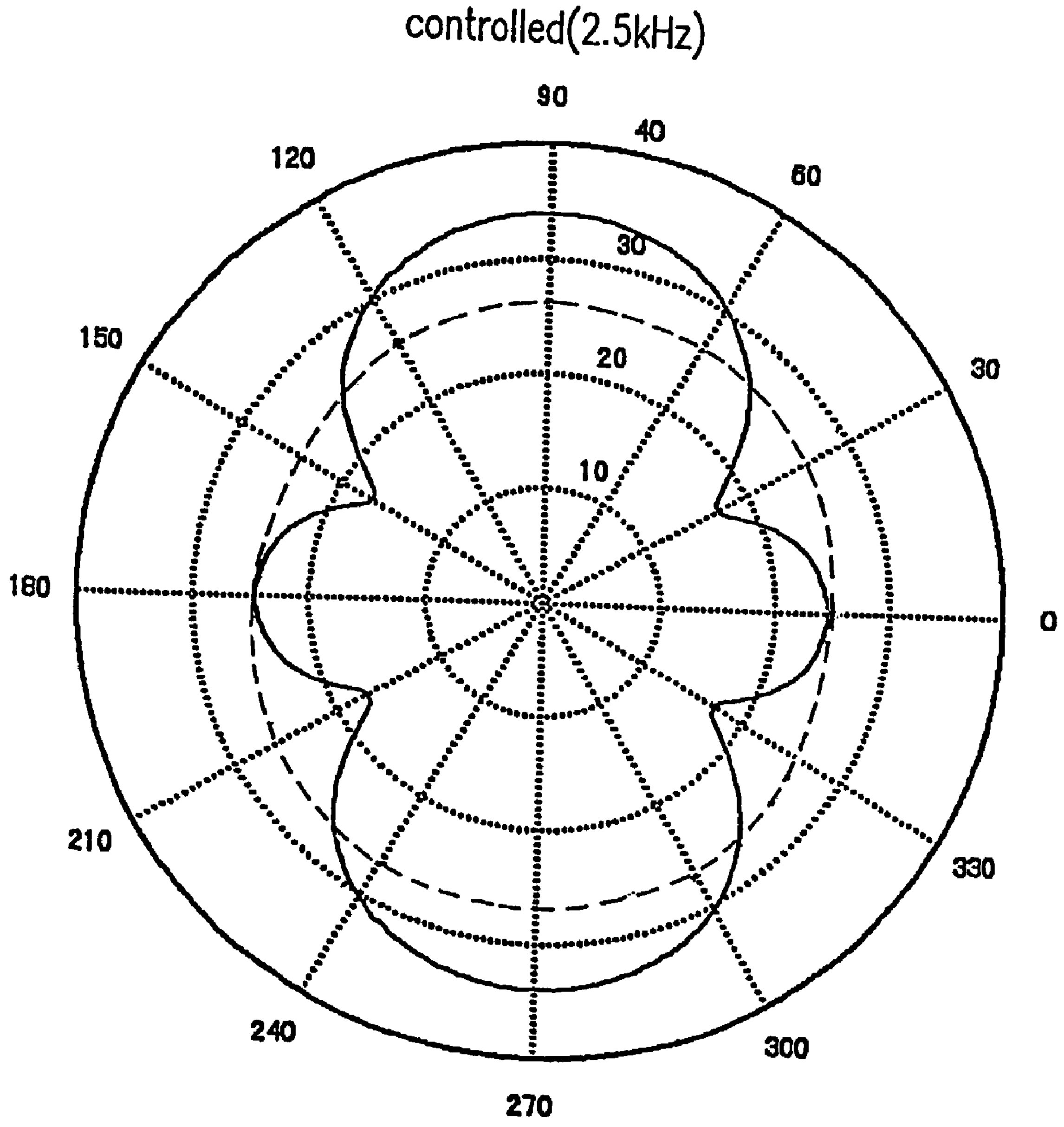
FIG. 12 shows directional characteristics of the loudspeakers 7, 8 and 9 of FIG. 11 measured in experiments.

FIG. 12 shows directional characteristics of the loudspeakers 7, 8 and 9 (the loudspeakers 7 and 8) measured in experiments. Here, experimental conditions are as follows: frequency of sound output by the three loudspeakers: 2.5 kHz; and target of measurement: relative sound pressure on a circle having a radius of 1 m and the center which is the midpoint of a line extending across the three loudspeakers.

In FIG. 12, the broken line indicates a directional characteristic (a first directional characteristic) of the loudspeakers 7 and 8 measured in experiments in the case where the loudspeakers 7 and 8 are driven by the loudspeaker drive section 6 (FIG. 11), and the solid line indicates a directional characteristic (a second directional characteristic) of the loudspeakers 7, 8 and 9 measured in experiments in the case where the loudspeakers 7, 8 and 9 are driven by the loudspeaker drive section 6*a* (FIG. 11). As can be seen from FIG. 12, the first and second directional characteristics are different from each other.

The first directional characteristic is a characteristic of a loudspeaker which outputs a sound signal toward every direction. The second directional characteristic is a characteristic of a loudspeaker which outputs a sound signal toward a specific direction.

It should be noted that the line extending across the three loudspeakers is assumed to be present on a 0°–180° line shown in FIG. 12.

From the results shown in FIG. 12, it is appreciated that sound signals input to the loudspeaker drive section 6*a* are output by the loudspeakers 7, 8 and 9 only toward the front direction, and sound signals input to the loudspeaker drive section 6 are output by the loudspeakers 7 and 8 toward every direction.

3. Design of the Filters 22, 23 and 24

Figure 13:
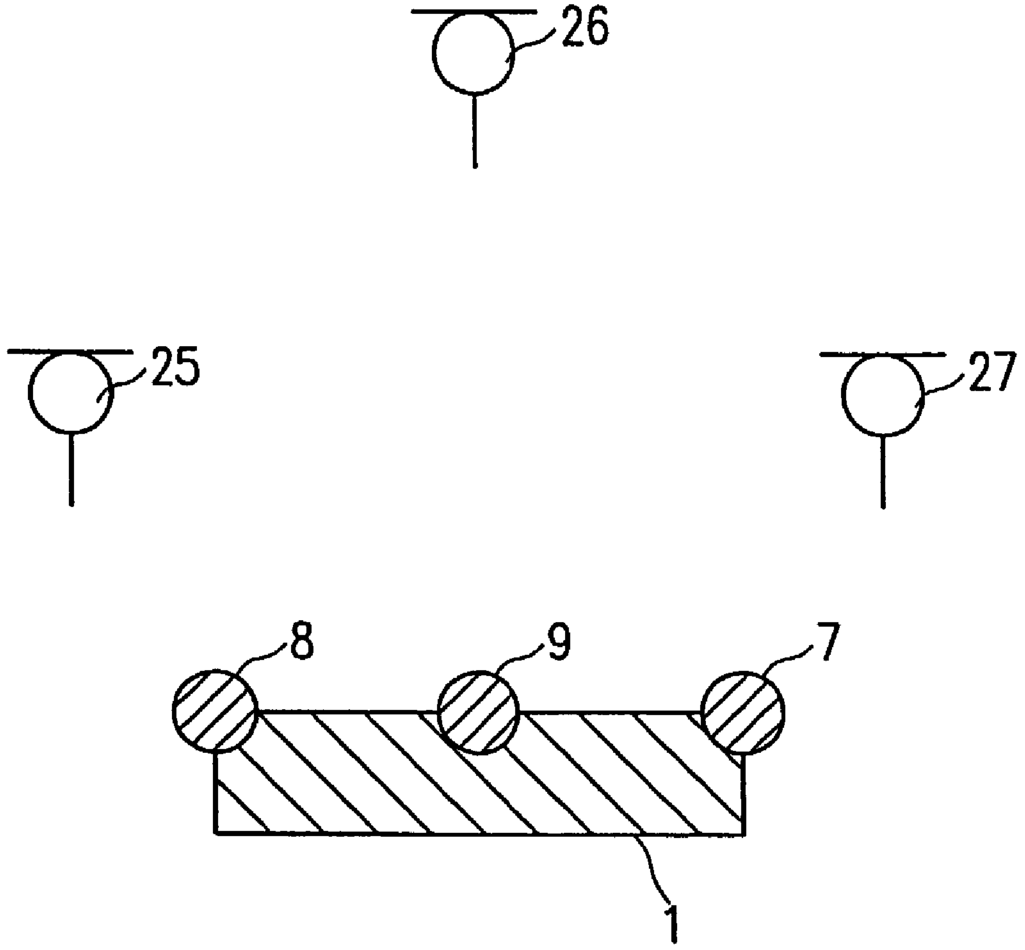
FIG. 13 is a diagram for explaining a method for designing filters 22, 23 and 24 in FIG. 11.

Referring to FIG. 13, a method for designing the filters 22, 23 and 24 is described.

FIG. 13 shows a positional arrangement of microphones 25, 26 and 27 for sound pressure measurement in the case where the filters 22, 23 and 24 are designed such that the loudspeakers 7, 8 and 9 have the second directional characteristic shown in FIG. 12. The microphone 25 for sound pressure measurement is positioned (at 150°) in a left oblique direction with respect to the mobile terminal apparatus 1. The microphone 26 for sound pressure measurement is positioned (at 90°) in a front direction with respect to the mobile terminal apparatus 1. The microphone 27 for sound pressure measurement is positioned (at 30°) in a right oblique direction with respect to the mobile terminal apparatus 1. Here, in order to design the filters 22, 23 and 24 such that the loudspeakers 7, 8 and 9 have the second directional characteristic, a filter coefficient (XR(z)) of the filter 22, a filter coefficient (XC(z)) of the filter 24 and a filter coefficient (XL(z)) of the filter 23 are required to be designed such that sound propagates in the front direction (90°) with respect to the mobile terminal apparatus 1 and sound is difficult to propagate in both the right oblique direction (30°) and the left oblique direction (150°) with respect to the mobile terminal apparatus 1.

The filter coefficient (XR(z)) of the filter 22, the filter coefficient (XC(z)) of the filter 24 and the filter coefficient (XL(z)) of the filter 23 are obtained according to expression 6, $$\begin{bmatrix} XL(z) \\ XC(z) \\ XR(z) \end{bmatrix} = \begin{bmatrix} HLl(z) & HCl(z) & HRl(z) \\ HLc(z) & HCc(z) & HRc(z) \\ HLr(z) & HCr(z) & HRr(z) \end{bmatrix}^{-1} \begin{bmatrix} Dl(z) \\ Dc(z) \\ Dr(z) \end{bmatrix}, \tag{6}$$

where HLr(z) denotes a transmission function from the loudspeaker 8 to the microphone 27 for sound pressure measurement, HLc(z) denotes a transmission function from the loudspeaker 8 to the microphone 26 for sound pressure measurement, HLl(z) denotes a transmission function from the loudspeaker 8 to the microphone 25 for sound pressure measurement, HCr(z) denotes a transmission function from the loudspeaker 9 to the microphone 27 for sound pressure measurement, HCc(z) denotes a transmission function from the loudspeaker 9 to the microphone 26 for sound pressure measurement, HCl(z) denotes a transmission function from the loudspeaker 9 to the microphone 25 for sound pressure measurement, HRr(z) denotes a transmission function from the loudspeaker 7 to the microphone 27 for sound pressure measurement, HRc(z) denotes a transmission function from the loudspeaker 7 to the microphone 26 for sound pressure measurement, HRl(z) denotes a transmission function from the loudspeaker 7 to the microphone 25 for sound pressure measurement, Dl(z) denotes a synthetic sound pressure measured by the microphone 25 for sound pressure measurement, Dc(z) denotes a synthetic sound pressure measured by the microphone 26 for sound pressure measurement, Dr(z) denotes a synthetic sound pressure measured by the microphone 27 for sound pressure measurement, Dl(z) =Dr(z)=0, and Dc(z)=1.

It should be noted that the notation "X(z)" indicates that X is represented by a z-polynomial expression.

The filters 22, 23 and 24 designed in this manner are digital filters, for example, IIR filters, FIR filters, or the like. The filters 22, 23 and 24 can be realized using analog circuits each including an op-amp or the like. The synthetic sound pressures (Dl(z), Dc(z), Dr(z)) realized at positions of the microphones for sound pressure measurement can have any suitable values.

Expression (6) utilizes representation in a frequency domain. When the filters are digital filters, the representation in a frequency domain can be transformed into representation in a time domain using an inverse Fourier transform or the like so as to obtain filter coefficients. For example, filter coefficients can be calculated using a method described in Toshiro OHGA, Yoshio YAMAZAKI, and Yutaka KANEDA, "Onkyo System to Digital Shingou Shori (Acoustic System and Digital Signal Processing)", (The Institute of Electronics, Information and Communication Engineers).

When calculating XL(z), XC(z) and XR(z) using expression (6),an inverse matrix is used. However, a method which does not use the inverse matrix, such as a QR-method, a method which uses singular value decomposition (e.g., G. Strang, Masaya YAMAGUCHI (translation supervisor), Akira INOUE (translator), "Linear Algebra and its Applications", (Sangyo Tosho)), or a sequential design method which uses an adaptation algorithm (e.g., Shigeo TSUJII, "Tekiou Shingou Shori (Adaptive Signal Processing)" (Shokodo Co., Ltd.)) can be used.

The filters are designed using three loudspeakers and three microphones for sound pressure measurement. However, the respective numbers of loudspeakers and microphones for sound pressure measurement are not limited to three. In general, when the number of loudspeakers is equal to or more than that of microphones for sound pressure measurement, control efficiency at positions of the microphones can be high as compared to a case where the number of loudspeakers is less than the number of microphones for sound pressure measurement. Although the case where the number of loudspeakers is less than the number of microphones for sound pressure measurement is inferior in control efficiency at positions of the microphones to the case where the number of loudspeakers is more than the number of microphones for sound pressure measurement, there is a tendency for sound pressure to be less variable with respect to change in position of sound receiving points. The respective numbers of microphones for sound pressure measurement and loudspeakers can be suitably determined so as to achieve desired control. However, the number of microphones for sound pressure measurement can be less than the number of loudspeakers.

4. Selection of the Loudspeakers' Directional Characteristics

Sound signals generated by the main processing section 2*a* are not necessarily output to both of the loudspeaker drive sections 6 and 6*a*. The sound signals can be output to one of the loudspeaker drive sections 6 and 6*a*. By selecting a loudspeaker drive section to which the sound signals are output, the loudspeakers' directional characteristics can be selected.

Figure 14:
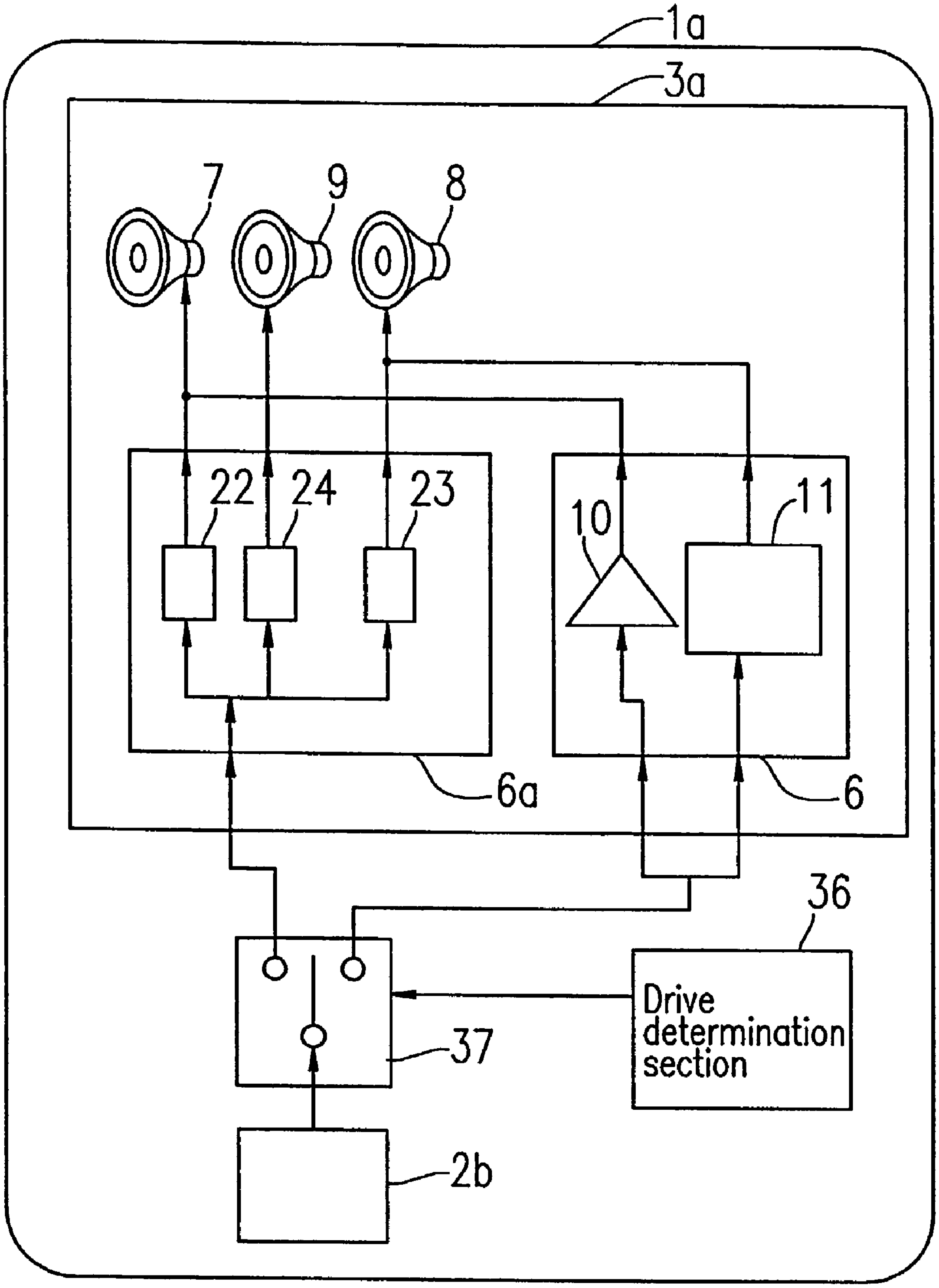
FIG. 14 shows an example of a structure of a mobile terminal apparatus 1*a* according to the present invention capable of selecting a loudspeaker's directional characteristic.

FIG. 14 shows an example of a structure of a mobile terminal apparatus 1*a* capable of selecting the loudspeakers' directional characteristics. The mobile terminal apparatus 1*a* includes a main processing section 2*b* (a signal generation section), a sound reproduction device 3*a*, a drive determination section 36 and a switching section 37.

The main processing section 2*b* generates a one-channel sound signal.

The drive determination section 36 determines based on a signal input by a user whether to drive the loudspeaker drive section 6 or 6*a*, and outputs a control signal, which represents a determination result, to the switching section 37.

The switching section 37 performs a switching operation according to the control signal output by the drive determination section 36 so as to output the one-channel sound signal generated by the main processing section 2*b* to the loudspeaker drive section 6 or 6*a*.

The structure of the sound reproduction device 3*a* shown in FIG. 14 is the same as that of the sound reproduction device 3*a* shown in FIG. 11.

In this manner, by selectively driving the loudspeaker drive sections 6 and 6*a*, it is possible to perform a switching operation so as to transfer sounds toward the front direction with respect to the mobile terminal apparatus 1 or toward every direction.

Further, the mobile terminal apparatus 1 can include three or more loudspeaker drive sections. In this case, the switching section 37 can perform a switching operation so as to output the sound signal generated by the main processing section 2*b* to either one of the three or more loudspeaker drive sections.

Figure 15:
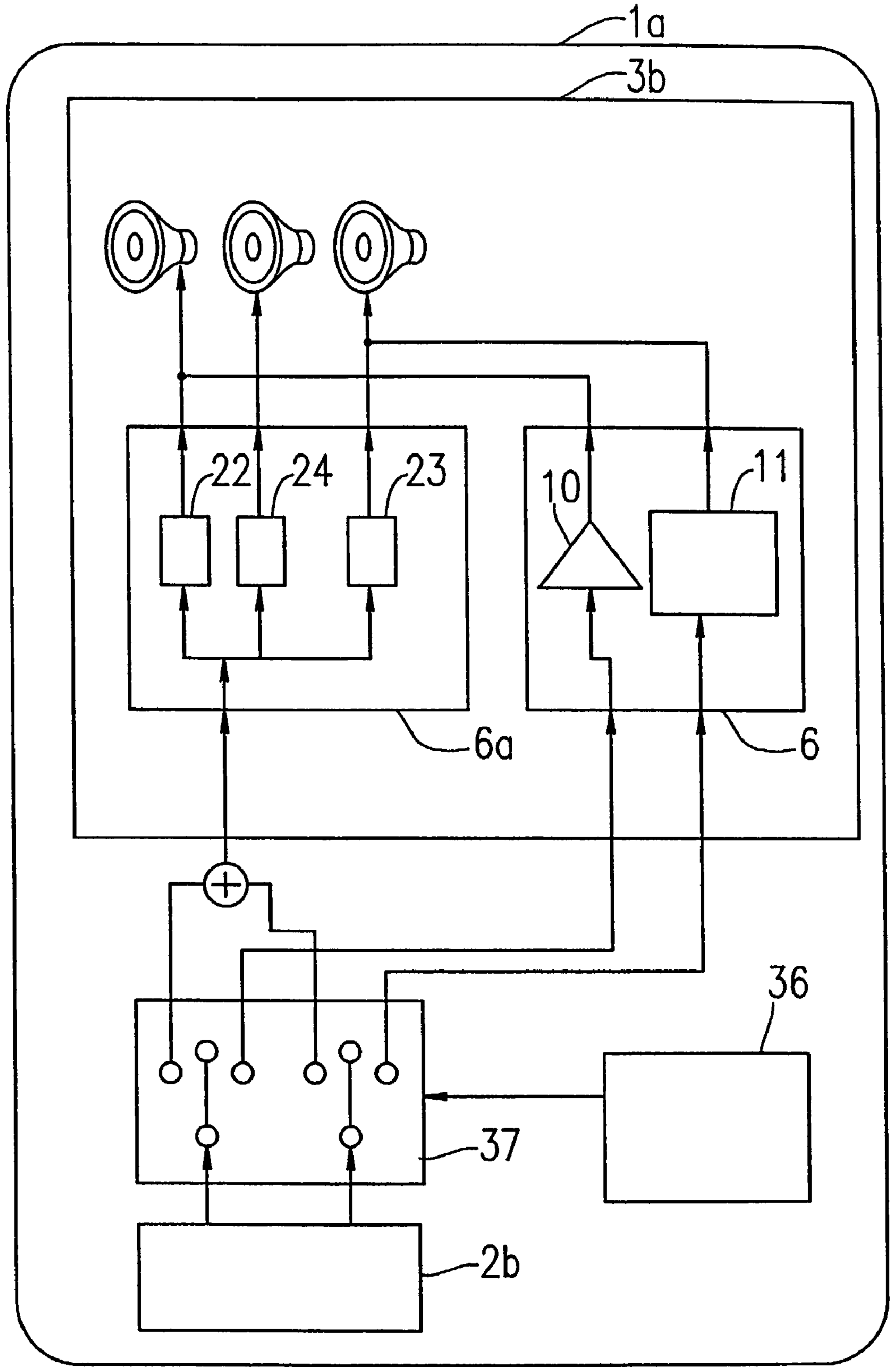
FIG. 15 shows an example of another structure of a mobile terminal apparatus 1*a* according to the present invention capable of selecting a loudspeaker's directional characteristic.

FIG. 15 shows another example of a structure of the mobile terminal apparatus 1*a* capable of selecting the loudspeakers' directional characteristics.

The mobile terminal apparatus 1*a* of FIG. 15 includes the main processing section 2*b* (signal generation section), a sound reproduction device 3*b*, the drive determination section 36 and the switching section 37.

The main processing section 2*b* generates two-channel sound signals.

The drive determination section 36 determines based on a signal input by a user whether to drive the loudspeaker drive section 6 or 6*a*, and outputs a control signal, which represents a determination result, to the switching section 37.

The switching section 37 performs a switching operation according to the control signal output by the drive determination section 36 so as to output the two-channel sound signals generated by the main processing section 2*b* to the loudspeaker drive section 6 or to output a signal, which is obtained by adding the two-channel sound signals together, to the loudspeaker drive section 6*a*.

The structure of the sound reproduction device 3*b* shown in FIG. 15 is the same as that of the sound reproduction device 3*a* shown in FIG. 11.

5. Another Example of a Structure of the Loudspeaker Drive Section 6*a*

The number of the filters included in the loudspeaker drive section 6*a* is not limited to three. The loudspeaker drive section 6*a* can include any number of filter(s) equal to or more than one. The number of the filters included in the loudspeaker drive section 6*a* can be two.

Figure 16:
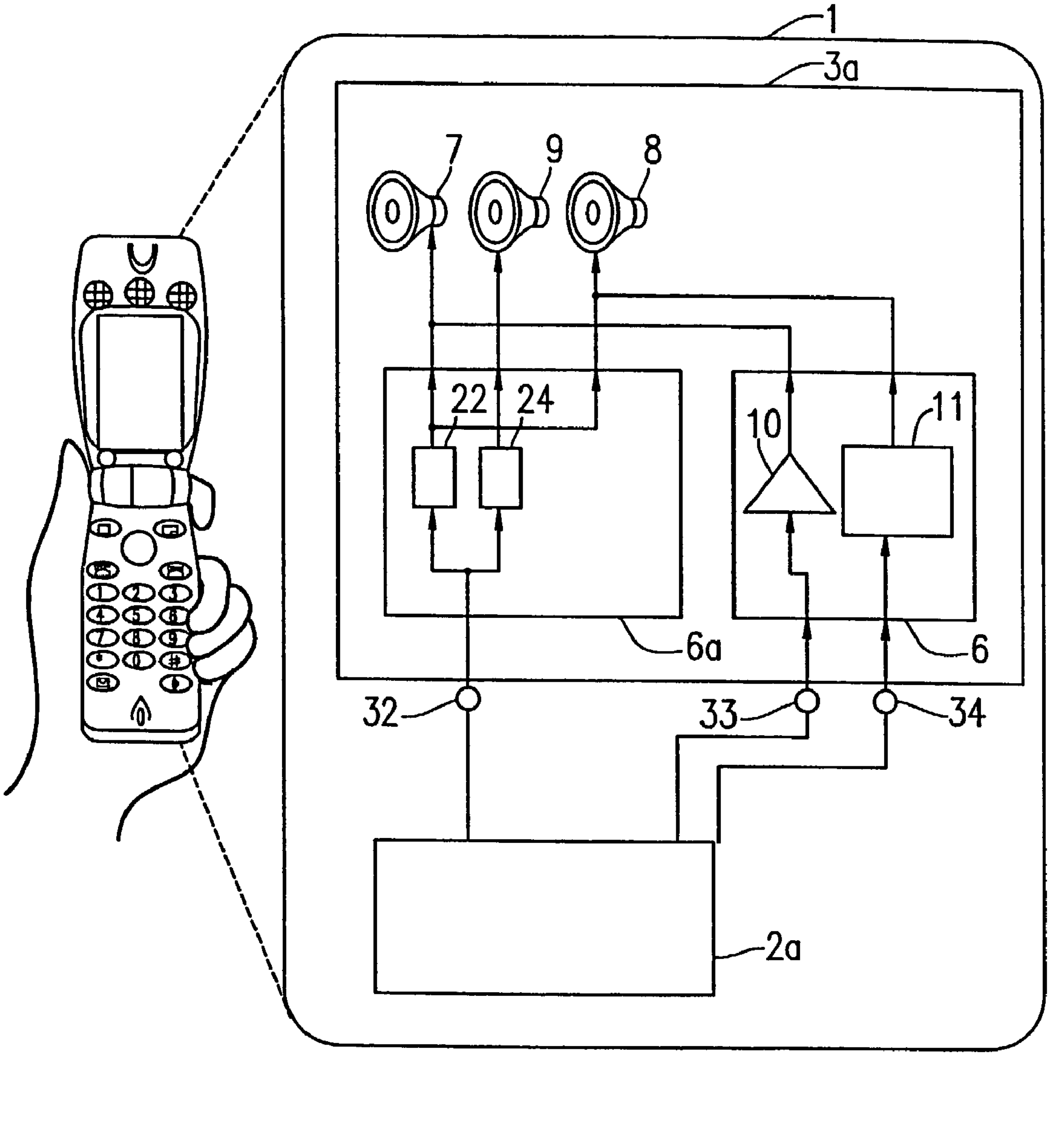
FIG. 16 shows an example of a structure of a loudspeaker drive section 6*a* according to the present invention including two filters.

FIG. 16 shows an example of a structure of the loudspeaker drive section 6*a* including two filters.

The structure of the loudspeaker drive section 6*a* shown in FIG. 16 can be obtained by omitting the filter 23 from the structure of the loudspeaker drive section 6*a* shown in FIG. 11.

For example, when positions at which microphones for sound pressure measurement are provided, sound pressures realized at such positions, and positions at which loudspeakers are provided are acoustically symmetrical, it often happens that the filter coefficient of the filter 22 becomes equivalent to that of the filter 23 as a result of the design of the filters 22, 23 and 24. In such a case, the filter 23 can be omitted. By configuring the loudspeaker drive section 6*a* such that outputs of the filter 22 are input to the loudspeakers 7 and 8, it is possible to reduce the number of operations performed and a circuit scale of the loudspeaker drive section 6*a*.

It should be noted that the loudspeaker drive section 6*a* shown in FIG. 16 can be used as those shown in FIG. 14 or 15.

6. Use of Acoustic Tubes

The number of the loudspeakers included in the sound reproduction device 3*a* is not limited to three. The sound reproduction device 3*a* can include any number of filters equal to or more than two. One of the loudspeakers included in the sound reproduction device 3*a* can be substituted by acoustic tubes.

Figure 17:
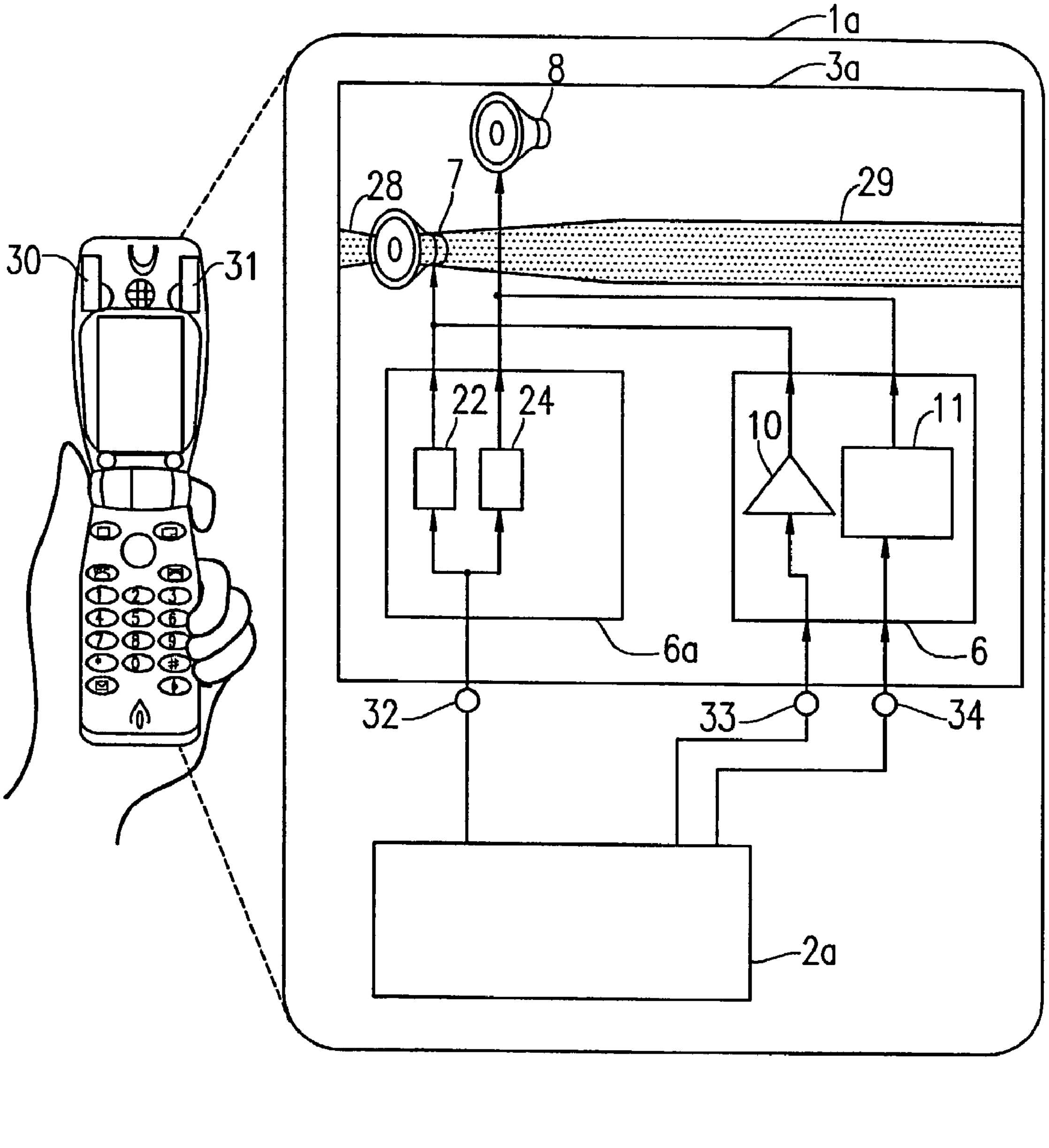
FIG. 17 shows an example of a structure of a sound reproduction apparatus 3*a* according to the present invention using acoustic tubes.

FIG. 17 shows an example of a structure of the sound reproduction device 3*a* using the acoustic tubes.

The sound reproduction device 3*a* includes the loudspeaker drive sections 6 and 6*a*, the loudspeakers 7 and 8, and acoustic tubes 28 and 29. The acoustic tubes 28 and 29 transfer sounds output by the loudspeaker 7 to the outside of the sound reproduction device 3*a*. For example, the acoustic tubes 28 and 29 transfer sounds output by the loudspeaker 7 through two sound holes 30 and 31 to the outside of the sound reproduction device 3*a*.

The structures and operations of the loudspeaker drive sections 6 and 6*a* shown in FIG. 17 are the same as those of the loudspeaker drive sections 6 and 6*a* shown in FIG. 16.

The acoustic tubes 28 and 29 can have the same shape. By using the acoustic tubes 28 and 29 having the same shape, it is possible to output equivalent acoustic signals through the sound holes 30 and 31.

In this manner, by using acoustic tubes, it is possible to substitute one loudspeaker with the acoustic tubes. Therefore, two loudspeakers can be used to achieve effects equivalent to those achieved by three loudspeakers.

According to the present invention, by driving the first and second loudspeakers at substantially the same phase in a low frequency band (a first frequency band) and driving the first and second loudspeakers at substantially inverse phase in a high frequency band (a second frequency band), it is possible to employ the advantages of the same-phase driving and the inverse-phase driving and complement the respective defects of the same-phase driving and the inverse-phase driving. As a result, it is possible to simultaneously solve the problem caused in the case of the same-phase driving that the dips occur in the 0°–180° direction in the vicinity of 4250 Hz and the problem caused in the case of the inverse-phase driving that the sound pressures are reduced along all the directions.

Further, by driving the first and second loudspeakers at different amplitude levels in the high frequency band, it is possible to solve the problem caused in the case of the inverse-phase driving that the dips occur in the 90°–270° direction.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A sound reproduction device comprising: a first loudspeaker; a second loudspeaker; a first loudspeaker drive section for driving the first and second loudspeakers, wherein the first loudspeaker drive section drives the first and second loudspeakers at substantially the same phase in a first frequency band, and the first loudspeaker drive section drives the first and second loudspeakers at substantially inverse phase and substantially different amplitude levels in a second frequency band higher than the first frequency band.

2. A sound reproduction device according to claim 1, wherein the first loudspeaker drive section processes a first sound signal so as to output to the first loudspeaker a first drive signal for driving the first loudspeaker, and processes a second sound signal so as to output to the second loudspeaker a second drive signal for driving the second loudspeaker, the first loudspeaker drive section including: a phase difference control section for controlling a difference in phase between the first and second drive signals so as to be in the vicinity of 0 degree in the first frequency band and in the vicinity of 180 degree in the second frequency band; and a gain difference control section for controlling a difference in gain between the first and second drive signals so as to be equal to or more than a prescribed value in a frequency band including at least the second frequency band.

3. A sound reproduction device according to claim 2, wherein the phase difference control section controls the difference in phase between the first and second drive signals so as to vary between 0 degree and 180 degree in a transition frequency band substantially provided between the first and second frequency bands.

4. A sound reproduction device according to claim 2, wherein the first loudspeaker drive section includes a filter for filtering one of the first and second sound signals and an amplifier for amplifying the other one of the first and second sound signals, the filter has a frequency phase characteristic for changing a phase of an input signal according to a frequency of the input signal, and the filter functions as the phase difference control section and the amplifier functions as the gain difference control section.

5. A sound reproduction device according to claim 2, wherein the first loudspeaker drive section includes a filter for filtering one of the first and second sound signals and an amplifier for amplifying an output of the filter, the filter has a frequency phase characteristic for changing a phase of an input signal according to a frequency of the input signal, and the filter functions as the phase difference control section and the amplifier functions as the gain difference control section.

6. A sound reproduction device according to claim 2, wherein the first loudspeaker drive section includes a filter for filtering one of the first and second sound signals, the filter has a frequency phase characteristic for changing a phase of an input signal according to a frequency of the input signal and a frequency gain characteristic for maintaining a gain which is non-zero and substantially constant with respect to the input signal regardless of the frequency of the input signal, and the filter functions as both the phase difference control section and the gain difference control section.

7. A sound reproduction device according to claim 2, wherein the first and second sound signals are obtained by distributing a monaural signal in prescribed proportions.

8. A sound reproduction device according to claim 1, wherein an interval between respective positions at which the first and second loudspeakers are provided is less than 17 cm.

9. A sound reproduction device according to claim 1, wherein the sound reproduction device is used in a mobile terminal apparatus.

10. A sound reproduction device according to claim 1, further comprising: a third speaker; and a second loudspeaker drive section for driving the first loudspeaker, the second loudspeaker and the third loudspeaker, wherein the first loudspeaker drive section drives the first and second loudspeakers so as to have first directional characteristics, the second loudspeaker drive section drives the first loudspeaker, the second loudspeaker and the third loudspeaker so as to have second directional characteristics, and the first and second directional characteristics are different from each other.

11. A sound reproduction device according to claim 10, wherein the second loudspeaker drive section includes: a first filter section connected to the first loudspeaker; a second filter section connected to the second loudspeaker; and a third filter section connected to the third loudspeaker, wherein at least two of a first filter coefficient of the first filter section, a second filter coefficient of the second filter section and a third filter coefficient of the third filter section are different from each other.

12. A sound reproduction device according to claim 10, wherein the second loudspeaker drive section includes: a first filter section connected to the first and second loudspeakers; and the third filter section connected to the third loudspeaker, wherein the first filter coefficient of the first filter section and the third filter coefficient of the third filter section are different from each other.

13. A sound reproduction device according to claim 1, further including: an acoustic tube for transmitting sound output by the first loudspeaker to the outside of the sound reproduction device; and a second loudspeaker drive section for driving the first and second loudspeakers, wherein the first loudspeaker drive section drives the first and second loudspeakers so as to have first directional characteristics, the second loudspeaker drive section drives the first loudspeaker and the second loudspeaker so that the acoustic tube and the second loudspeaker have second directional characteristics, and the first and second directional characteristics are different from each other.

14. A sound reproduction device according to claim 1, further including a third loudspeaker and a second loudspeaker drive section, said sound reproduction device included in a mobile terminal apparatus which includes a drive determination section for determining whether to drive the first loudspeaker drive section or the second loudspeaker drive section;

a signal generation section for generating a sound signal; and a switching section for performing a switching operation so as to output the sound signal generated by the signal generation section to the first loudspeaker drive section or the second loudspeaker drive section according to a determination result of the drive determination section, wherein the first loudspeaker drive section drives the first and second loudspeakers so as to have first directional characteristics, the first loudspeaker drive section drives the first and second loudspeakers at substantially inverse phase and substantially different amplitude levels in a second frequency band higher than the first frequency band, the second loudspeaker drive section drives the first loudspeaker, the second loudspeaker and the third loudspeaker so as to have second directional characteristics, and the first and second directional characteristics are different from each other.

* * * * *